US012738626B2

(12) United States Patent
Hendrix et al.

(10) Patent No.: US 12,738,626 B2
(45) Date of Patent: Sep. 15, 2026

(54) DATA AGGREGATION AND COMPUTE MODULE

(71) Applicant: viaPhoton, Inc., Aurora, IL (US)

(72) Inventors: Walter Mark Hendrix, Richardson, TX (US); Mark James Smrha, Chicago, IL (US)

(*) Notice: Subject to any disclaimer, the term of this patent is extended or adjusted under 35 U.S.C. 154(b) by 244 days.

(21) Appl. No.: 18/452,498

(22) Filed: Aug. 18, 2023

(65) Prior Publication Data

US 2024/0063523 A1 Feb. 22, 2024

Related U.S. Application Data

(60) Provisional application No. 63/399,473, filed on Aug. 19, 2022.

(51) Int. Cl.

*H05K 7/20* (2006.01)
*H01Q 1/02* (2006.01)
*H05K 5/02* (2006.01)

(52) U.S. Cl.

CPC ............ *H01Q 1/02* (2013.01); *H05K 5/0247* (2013.01); *H05K 5/0291* (2013.01); *H05K 7/20409* (2013.01)

(58) Field of Classification Search

CPC ....... H05K 5/0247; H05K 5/0291; H01Q 1/02
See application file for complete search history.

(56) References Cited

U.S. PATENT DOCUMENTS

| | | | | |
|---|---|---|---|---|
| 9,941,917 | B2 * | 4/2018 | Wang | H04W 52/00 |
| 10,795,096 | B1 * | 10/2020 | Leigh | G02B 6/3883 |
| 2008/0239688 | A1 * | 10/2008 | Casey | H05K 7/20563 361/796 |
| 2021/0112315 | A1 * | 4/2021 | Mays | G02B 6/4268 |
| 2021/0399463 | A1 * | 12/2021 | Amer | H01R 13/5202 |
| 2023/0007808 | A1 * | 1/2023 | Lau | H05K 7/20445 |

* cited by examiner

*Primary Examiner* — Mukundbhai G Patel

(74) *Attorney, Agent, or Firm* — Ferguson Braswell Fraser Kubasta PC

(57) ABSTRACT

An apparatus forms an aggregation module. The apparatus includes a support structure to support multiple plug-in cards. The plug-in cards are insertable along an insertion direction. The apparatus further includes a front access panel openable to access the plug-in cards. The apparatus further includes the support structure and the plug-in cards forming an airflow path along an airflow direction.

20 Claims, 25 Drawing Sheets

100

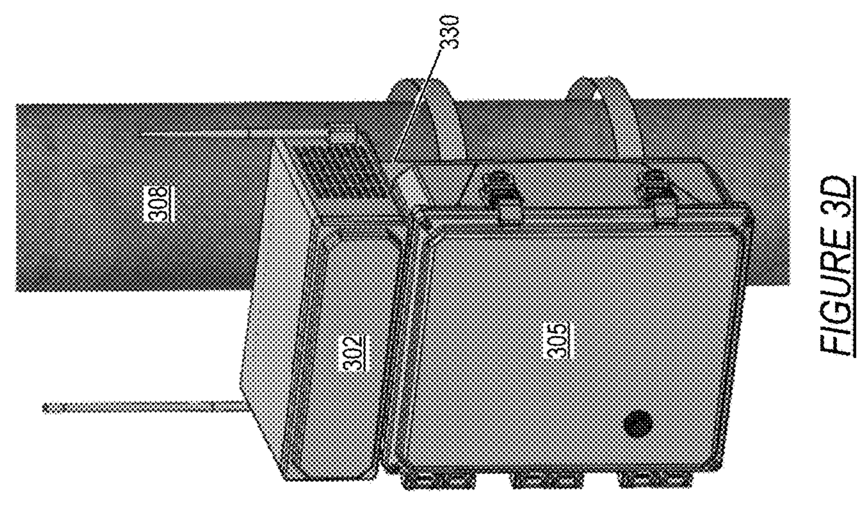
FIGURE 3D
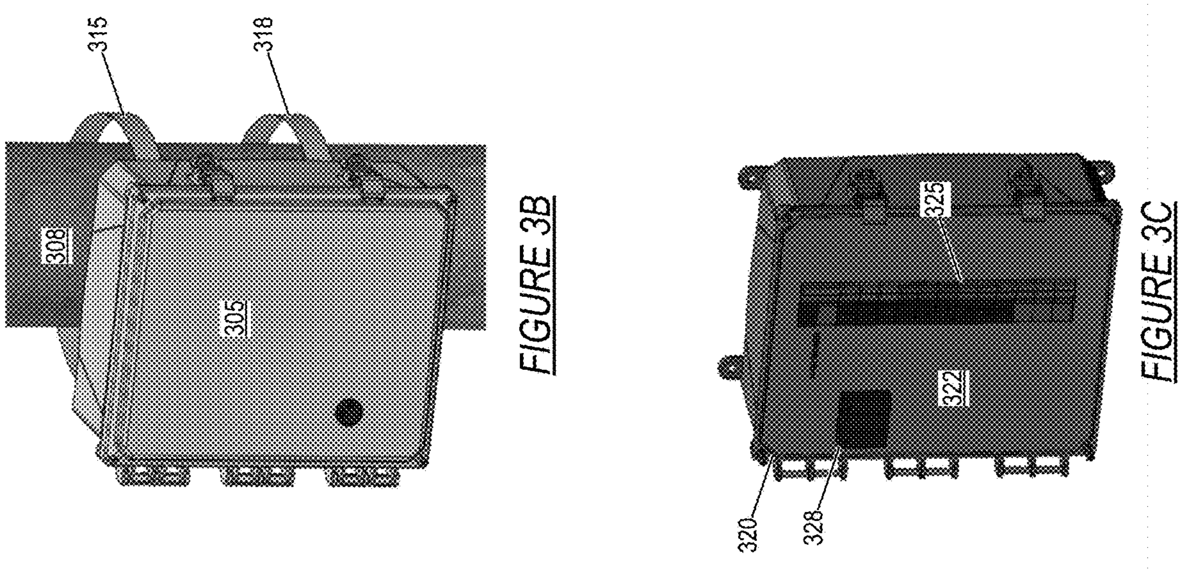
FIGURE 3B
FIGURE 3C
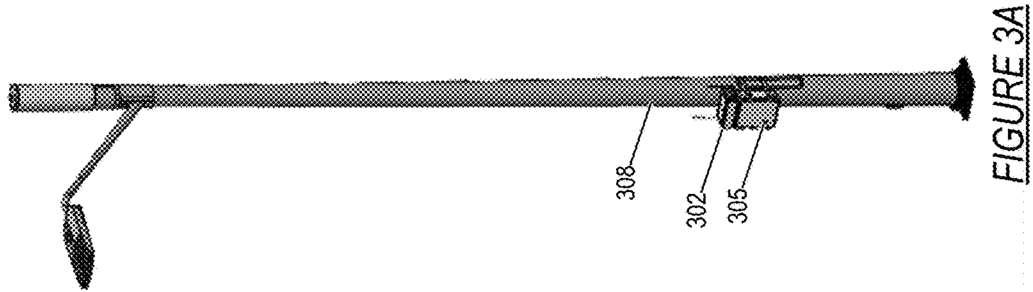
FIGURE 3A

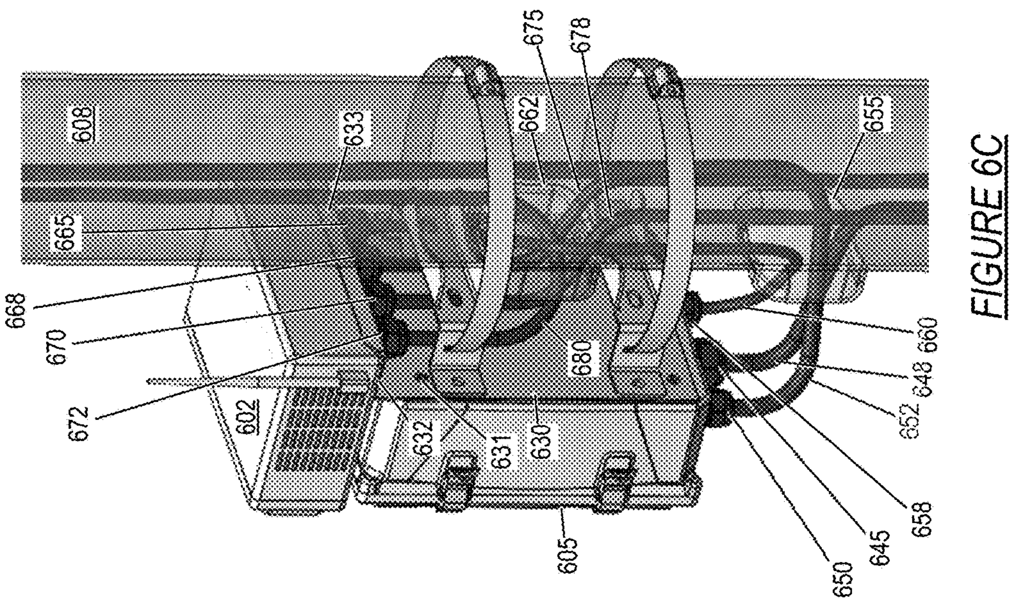
FIGURE 6C
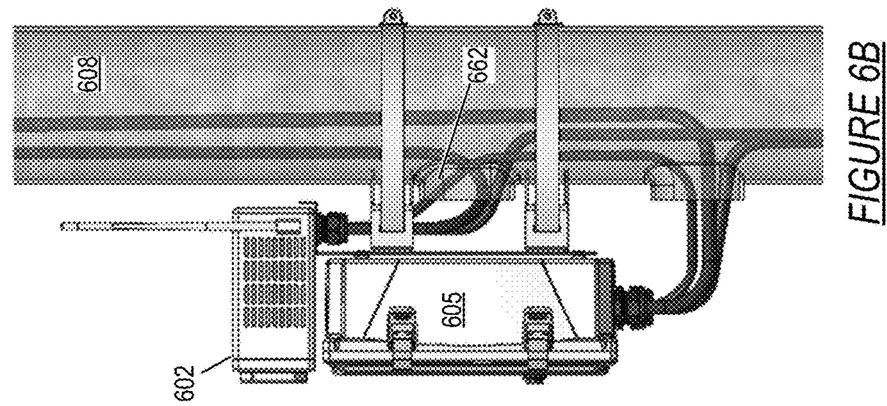
FIGURE 6B
FIGURE 6
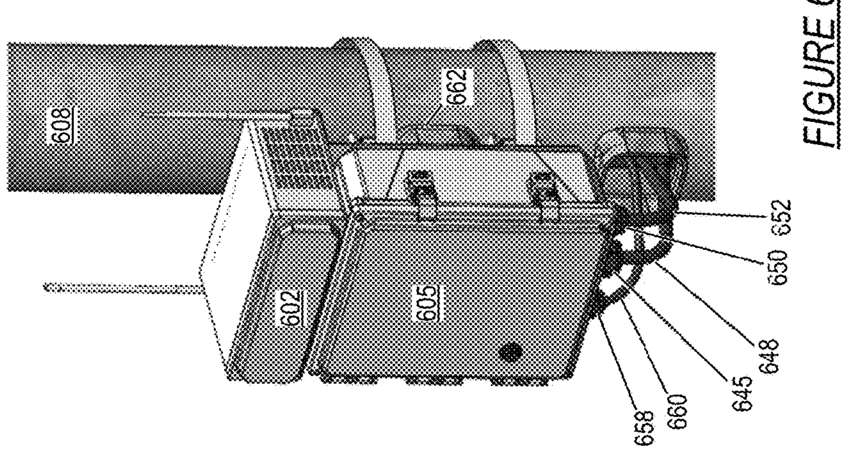
FIGURE 6A

DATA AGGREGATION AND COMPUTE MODULE

CROSS REFERENCE TO RELATED APPLICATIONS

This application claims the benefit of U.S. Provisional Application 63/399,473, filed Aug. 19, 2022, which is incorporated by reference herein.

BACKGROUND

Cell sites, also referred to as a cell towers or base stations, are components of cellular network infrastructure. Cell sites are physical structures that may be equipped with antennas and communication equipment that enables wireless communication between mobile devices, such as cell phones, and the larger telecommunications network. Cell sites provide wireless coverage and maintain seamless communication by transmitting and receiving signals to and from mobile devices within their coverage area. These sites are strategically placed in locations to ensure optimal coverage and capacity for users. Multiple cell sites are interconnected to form a cellular network that covers a specific geographic area.

Cell sites include several components. Antennas transmit and receive radio frequency (RF) signals to communicate with mobile devices. Transceivers convert data and voice signals from digital to analog, and vice versa, for transmission between the cell site and mobile devices. Baseband equipment processes and manages the communication between the cell site and the core network of the cellular provider. Power supply and backup systems provide a stable power source that may be equipped with backup power systems (such as batteries or generators) to provide uninterrupted operation during power outages. Backhaul connections provide a high-speed connection (the backhaul) to the core network, typically using fiber-optic cables, microwave links, or other means. Control and monitoring equipment manage the operation, performance, and maintenance of the cell site. A challenge with cell sites is to provide data collection and processing for data generated in the area served by the cell site.

SUMMARY

In general, in one or more aspects, the disclosure relates to an apparatus forming an aggregation module. The apparatus includes a support structure to support multiple plug-in cards. The plug-in cards are insertable along an insertion direction. The apparatus further includes a front access panel openable to access the plug-in cards. The apparatus further includes the support structure and the plug-in cards forming an airflow path along an airflow direction.

In general, in one or more aspects, the disclosure relates to a system. The system includes a power box and an aggregation module. The aggregation module includes a support structure to support multiple plug-in cards. The plug-in cards are insertable along an insertion direction. The aggregation module further includes a front access panel openable to access the plug-in cards. The aggregation module includes the support structure and the plug-in cards forming an airflow path along an airflow direction.

In general, in one or more aspects, the disclosure relates to a method. The method includes installing a power box to a pole at a cell site. The method further includes installing an aggregation module to the power box. The aggregation module includes a support structure to support multiple plug-in cards. The plug-in cards are insertable along an insertion direction. The aggregation module further includes a front access panel openable to access the plug-in cards. The aggregation module further includes the support structure and the plug-in cards forming an airflow path along an airflow direction.

Other aspects of the one or more embodiments will be apparent from the following description and the appended claims.

BRIEF DESCRIPTION OF DRAWINGS

FIG. 3A, FIG. 3B, FIG. 3C, FIG. 3D, FIG. 4A, FIG. 4B, FIG. 5A, FIG. 5B, FIG. 5C, FIG. 6A, FIG. 6B, FIG. 6C, FIG. 7A, FIG. 7B, FIG. 8, FIG. 9A, FIG. 9B, FIG. 10, FIG. 11, FIG. 12, FIG. 13A, FIG. 13B, FIG. 14, FIG. 15A, FIG. 15B, FIG. 16A, FIG. 16B, FIG. 17A, FIG. 17B, FIG. 18, FIG. 19, FIG. 20, FIG. 21, FIG. 22A, FIG. 22B, FIG. 23, FIG. 24A, and FIG. 24B show examples in accordance with one or more embodiments of the disclosure.

Like elements in the various figures are denoted by like reference numerals for consistency.

DETAILED DESCRIPTION

In general, one or more embodiments are directed to data aggregation and compute modules (refers to as aggregation modules) that provide data collection and processing for data generated in the area served by a cell site. An aggregation module may be installed on top of a power box that is affixed to a tower or pole of a cell site. The aggregation module may include a support structure with multiple slots to receive plug-in cards to provide data processing capabilities. The plug-in cards may be accessible through a front panel. The insertion direction for the plug-in cards into the creation module may be transverse to an air flow direction of an airflow path within the aggregation module.

Figure 1:
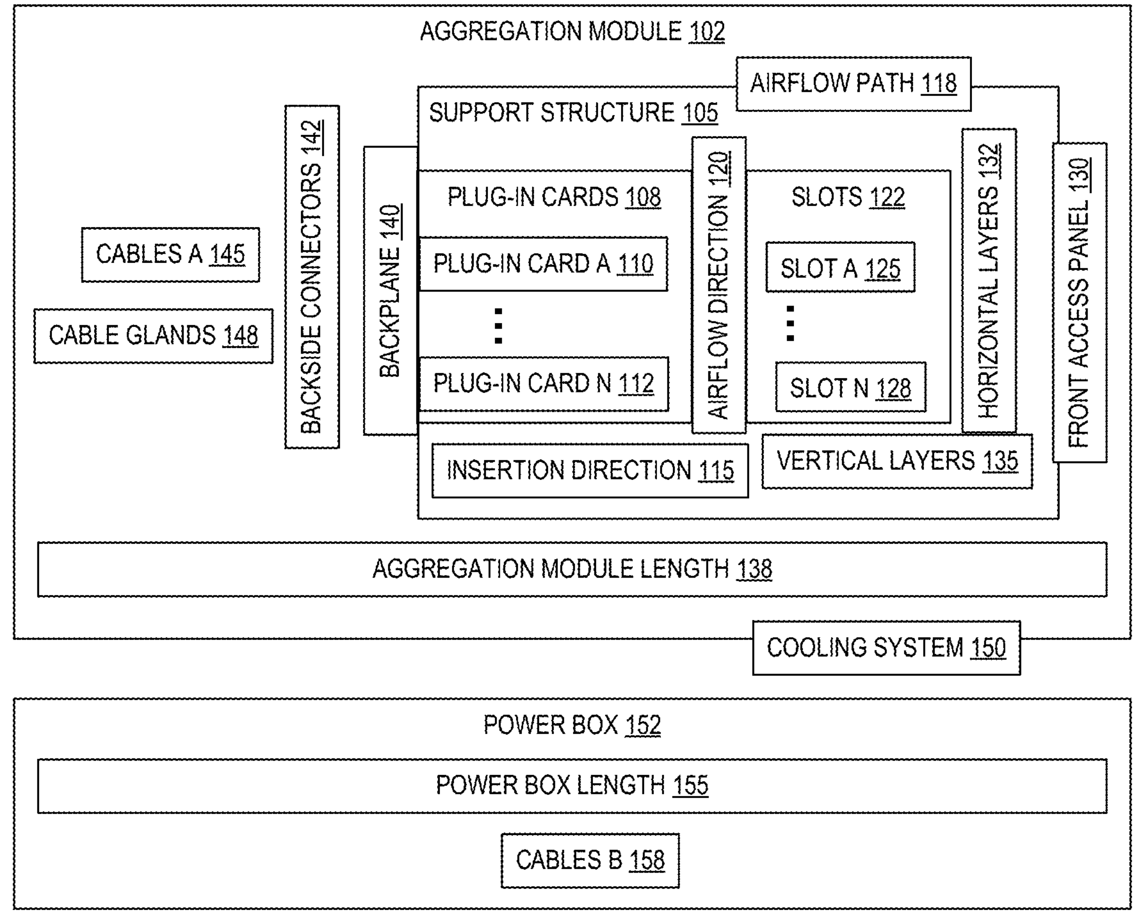
FIG. 1 shows a system, in accordance with one or more embodiments of the disclosure.
Figure 1:

Turning to FIG. 1, the system (100) provides data processing and collection functions to a cell site for data generated near the cell site. The system (100) includes the aggregation module (102) and the power box (152).

The aggregation module (102) is a component of a cell site that provides data processing collection functions. The aggregation module (102) includes multiple components including the support structure (105).

The support structure (105) supports the plug-in cards (108) and provides the airflow path (118). In one embodiment, the support structure (105) is made of rigid plastic that forms the slots (122) into which the plug-in cards (108) may be fitted.

Figure 25A:
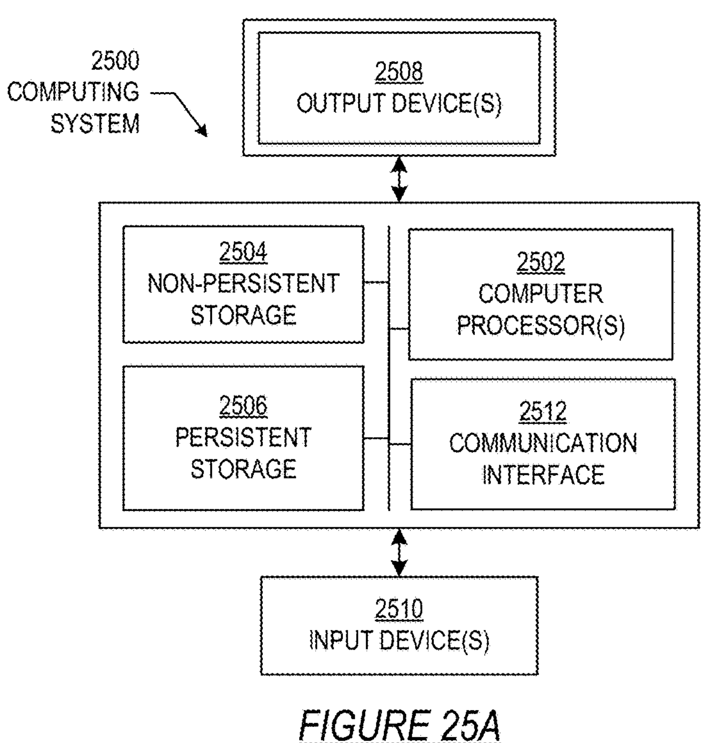
FIG. 25A and FIG. 25B show a computing system and network environment, in accordance with one or more embodiments of the disclosure.
Figure 25B:
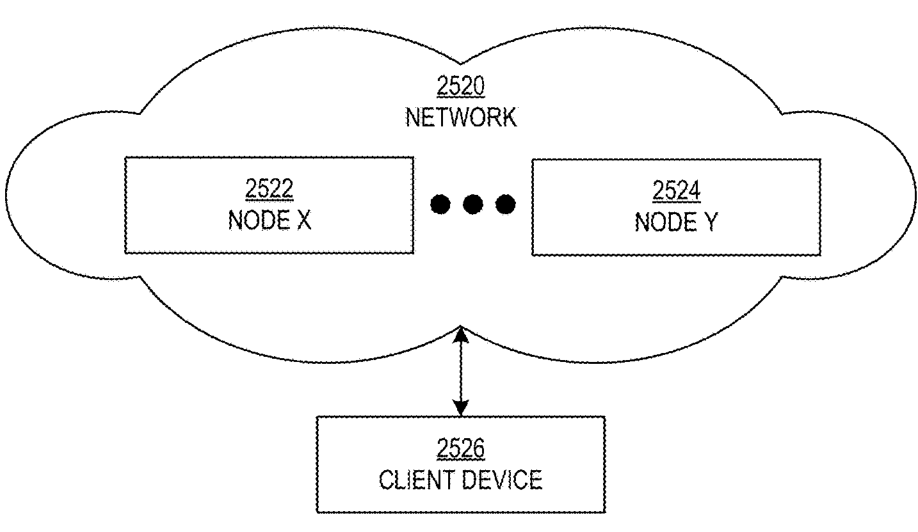

The plug-in cards (108) provide data processing and collection functions and may include computing systems as described with FIGS. 25A and 25B. Different cards may provide different functions. The plug-in cards (108) include the plug-in card A (110) through the plug-in card N (112). The plug-in cards (108) may include a fiber interface card, a power distribution card, a compute card, a long range wireless access card, a short range wireless access card, etc. The plug-in cards (108) are inserted through the front access panel (130) along the insertion direction (115) into the support structure (105) to connect to the backplane (140).

The insertion direction (115) is the direction through which the plug-in cards (108) are inserted into the slots (122) of the support structure (105). The insertion direction (115) may be transverse to the airflow direction (120). For example, the insertion direction (115) may be along an x-axis or depth dimension of the aggregation module (102) with the airflow path (118) along a y-axis or width dimension of the aggregation module (102).

The airflow path (118) is the path of airflow through the aggregation module (102). The air flowing through the aggregation module (102) along the airflow path (118) cools the plug-in cards (108) and corresponding components.

The airflow direction (120) is the direction of the flow of air along the airflow path (118). The airflow direction (120) is transverse to the insertion direction (115) for the plug-in cards (108).

The slots (122) are slots formed by the support structure (105) to receive the plug-in cards (108). The slots (122) include the slot A (125) through the slot N (128) that correspond to the plug-in card A (110) and plug-in card N (112). The slots (122) may be organized into sets of layers that include the horizontal layers (132) and the vertical layers (135).

The horizontal layers (132) are orthogonal to the vertical layers (135). From the perspective of the page of FIG. 1, the horizontal layers (132) may be parallel to the page of FIG. 1 and the vertical layers (135) may be orthogonal to the page of FIG. 1. In one embodiment, the horizontal layers (132) may correspond with the airflow direction (120) of the airflow path (118). Both the horizontal layers (132) and the vertical layers (135) may be orthogonal to the insertion direction (115). Multiple ones of the plug-in cards (108) may be part of a one of the horizontal layers (132) and be part of one of the vertical layers (135). For example, one of the horizontal layers (132) may include at least two of the plug-in cards (108) and one of the vertical layers (135) may include at least three of the plug-in cards (108). In one embodiment, when each of the horizontal layers (132) includes two of the plug-in cards (108) and when each of the vertical layers (135) includes three of the plug-in cards (108), the aggregation module (102) includes six of the plug-in cards (108).

Different embodiments may include different organizations of layers and different numbers of plug-in cards. For example, a first horizontal layer may include two slots having a single slot width and a second horizontal layer may include a single slot having a double slot width for a total of three plug-in cards.

The front access panel (130) is a panel used to access the plug-in cards (108) for installation and maintenance. The front access panel (130) may be movably attached to the aggregation module (102).

The aggregation module length (138) is a length along a dimension of the aggregation module (102). In one embodiment, the aggregation module length (138) is a horizontal length of the aggregation module (102). The aggregation module length (138) may be similar to the power box length (155).

The backplane (140) is a set of interconnected circuit boards that provide a central communication pathway for various components and modules within the aggregation module (102), including for the plug-in cards (108). The backplane (140) may include connectors, slots, and traces that facilitate the flow of data and power between the different components. The backplane (140) includes the backside connectors (142).

The backside connectors (142) are connectors on a side of the backplane (140). In one embodiment, the backside connectors (142) are on a side of the backplane (140) that is opposite to the side into which the plug-in cards (108) are connected to the backplane (140).

The cables A (145) are physical cables and wiring used to connect and transmit signals between different components within and external to the aggregation module (102). The cables A (145) may include the following types of cables. Coaxial cables, which may carry radio frequency (RF) signals between different antennas, transceivers, and other RF devices. Fiber optic cables, which may transmit data using light signals to link various network elements, such as base stations, routers, and switches. Power cables, which may provide electrical power to the various components at the cell site, including transmitters, antennas, and networking equipment. Ethernet cables, which may be used for local wired network connections between different devices, such as routers, switches, and servers. Control cables, which may transmit control signals between different parts of the equipment at the cell cite to manage and coordinate the functioning of network elements. Grounding cables, which may be used to establish proper grounding and electrical safety at the cell site to protect equipment and personnel from electrical surges and hazards. Interconnect cables, which may link various pieces of equipment within the cell site, ensuring seamless communication between different components.

The cable glands (148), also referred to as cable connectors or cable fittings, are devices used to secure and protect the passage of the cables A (145) into the aggregation module (102). The cable glands (148) may provide the following functions, including cable protection, please, interference shielding, section, sealing and ingress protection (IP) ratings. Cable protection may include providing a secure and watertight seal around the point where a cable enters an enclosure to protect the cable from environmental factors such as dust, moisture, dirt, and chemicals, which could otherwise damage or interfere with performance of the cable. Strain relief may be provided by anchoring a cable and preventing excessive stress or tension on the connection points for the cable to prevent the cable from being accidentally pulled or strained and reduce the risk of damage to both the cable and the equipment which the cable is connected. Electromagnetic interference shielding may be provided reduce or minimize the impact of external electromagnetic fields on sensitive electronic equipment by creating a barrier around the cable entry point to the aggregation module (102). Fire protection may be provided to prevent flames or gases from spreading along the cable pathway for applications dealing with hazardous environments or fire-prone areas to provide a level of fire resistance. Sealing and ingress protection ratings indicate the ability of the cable glands (148) to resist the entry of solids and liquids, which may be used for outdoor or industrial settings where cables may be exposed to challenging conditions.

The cable glands (148) may use different materials, sizes, and designs to accommodate different types of cables, from electrical power cables to data communication cables and fiber optic cables. The cable glands (148) may include a threaded body that screws into a hole in aggregation module (102), along with a sealing or clamping mechanism to hold the cable securely in place. Additionally, the cable glands (148) may include features such as multiple cable entries, adjustable clamping ranges, locking mechanisms, etc.

The cooling system (150) is a set of components and mechanisms designed to regulate and dissipate heat generated by the various hardware components within the aggregation module (102) to prevent overheating-related damage and extend the lifespan of the components within the aggregation module (102). The plug-in cards (108), as well as other components, may produce heat as a natural byproduct of operation and use, which may lead to temperature increases that, if left unchecked, may adversely affect the performance, stability, and longevity of the aggregation module (102) and the system (100).

The cooling system (150) works to maintain and operating temperature of the components within the aggregation module (102) within an optimal temperature range. Components and methods used by the cooling system (150) may include heat sinks, fans, liquid cooling, thermal paste, case design and air flow, temperature sensors and control, etc. Heat sinks may be passive cooling components made of thermally conductive materials, often metal, that increase the surface area available for heat dissipation and help transfer heat away from the heat-generating components like processors and power converters. Fans are active cooling components that may circulate air around the heat sinks and other hot areas within the aggregation module (102) to dissipate heat by blowing cooler air over the heat-generating components and expelling hot air from the aggregation module (102). Liquid cooling systems use a combination of a pump, tubes, and a heat exchanger (radiator) to circulate a liquid coolant through a closed loop with the coolant absorbing heat from components and is then being cooled as it passes through the radiator. Thermal paste, also known as thermal compound or thermal grease, is a material applied between the heat-generating component and a heat sink to enhance thermal conductivity and efficient heat transfer between the two surfaces. Case design and airflow, including cable management and airflow optimization may include strategically placed vents, fan mounts, and routing options to form the airflow path (118) and facilitate the movement of cool air into and hot air out of the aggregation module (102). Temperature sensors and controllers may be used to monitor various parts of the aggregation module (102) collect temperature readings and adjust fan speeds and other cooling parameters to maintain operating temperature within the optimum temperature range.

The power box (152), also referred to as a power cabinet or power enclosure, houses the electrical equipment necessary to provide power to the various components and systems at a cellular network site. The power box (152) may deliver reliable and uninterrupted power to the equipment and perform functions including power distribution, battery backup, power conditioning, remote monitoring and control, environmental protection, safety, etc. Power distribution may be provided using components including circuit breakers, fuses, and power distribution panels to manage the distribution of electrical power to different parts of the cell site, including antennas, transceivers, routers, and other network equipment. Battery backup may provide temporary power during outages or fluctuations in the main power supply to maintain operations and connectivity. Power conditioning may be provided by voltage regulators and surge protectors, so that the electrical power supplied to the components at the cell site is stable and free from voltage spikes or surges. Remote monitoring and control may be provided using equipment to monitor the power status, battery health, and overall performance of the power system of the cell site remotely. Environmental protection may be provided to protect the electrical components from environmental factors such as dust, moisture, and extreme temperatures, which could otherwise impact the reliability and lifespan of the equipment. Safety may be provided by enclosing dangerous components within the power box (152) to prevent unauthorized access and reduce electrical hazards.

The power box length (155) is a length along a dimension of the power box (152). In one embodiment, the power box length (155) is a horizontal length of the power box (152), which may be referred to as a width. The power box length (155) may be similar to the aggregation module length (138).

The cables B (158) are physical cables and wiring used to connect and transmit signals between different components within and external to the power box (152). The cables B (158) may include power cables and other cables as described with the cables A (145).

Figure 2:
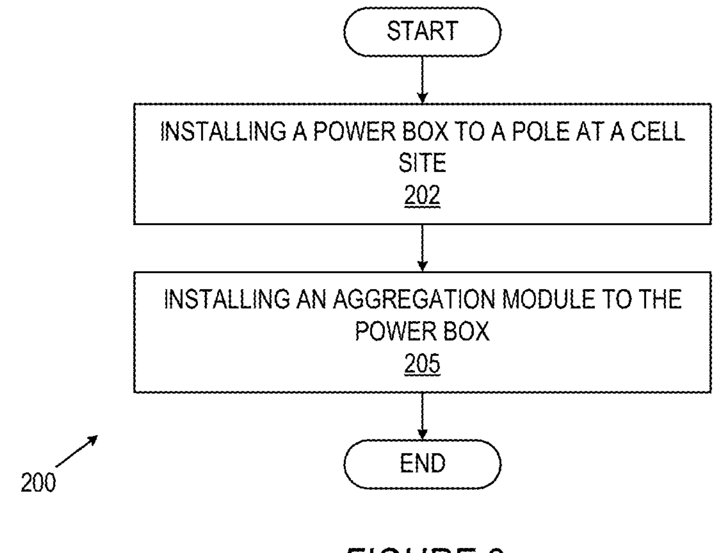
FIG. 2 shows a method in accordance with one or more embodiments of the disclosure.

Turning to FIG. 2, the process (200) installs an aggregation module. The process (200) may install and aggregation module in accordance with the system (100) of FIG. 1.

Step 202 of the process (200) includes installing a power box to a pole at a cell site. Installing the power box may involve several steps for proper placement, connection, and functionality. The power box may be securely mounted to the pole using appropriate mounting brackets, clamps, or other hardware. The power box is properly aligned and positioned on the pole to facilitate cable connections and airflow for cooling. Cables from the power box are routed within the power box using cable trays, tracks, clamps, or other cable management solutions. Cable routing may be laid out to minimize interference with other equipment and maintain proper separation from communication cables. Electrical connections are made between the power box and the electrical system for the pole, which may include connecting power cables from the power box to the appropriate power source, such as the main electrical grid or an on-site generator. Connections of the cables may be terminated, secured, and tested to ensure proper electrical continuity. Batteries may be installed and connected for battery backup systems with battery cables and connectors secured and tested to ensure reliable backup power. Proper grounding is established for the power box to mitigate electrical hazards and protect against lightning strikes by securely attaching to a grounding system of the pole. Testing of the power box may be performed and include testing the electrical connections, battery backup, remote monitoring (if available), voltage levels, current loads, and other relevant parameters to ensure proper functionality.

Step 205 of the process (200) includes installing an aggregation module to the power box. Installing the aggregation module may involve several steps for proper integration, placement, connection, and functionality. Mounting holes on the aggregation module may be aligned with corresponding mounting points on the power box. The aggregation module may be securely mounted to the power box using suitable mounting brackets, screws, or other hardware components. Cables between the aggregation module and the power box are connected. The cables may include power cables, data cables, communication cables, electrical cables, fiber optic cables, power cables, etc. Prior to connection, the cables may be properly routed, secured, and organized to prevent interference between components within the aggregation module and allow for airflow through the aggregation module. The aggregation module is connected to a power source through one of the cables to the power box. The voltage and current for the power may be measured for compatibility between the output from the power box and the input of the aggregation module. Network settings of the components within the aggregation module may be set, which may include internet protocol (IP) addresses and network protocols, to enable communication with other network equipment and devices at the cell site. The aggregation module may be powered on to conduct component testing to ensure the aggregation module starts up properly and communicates with the network. The aggregation module may be monitored for abnormal behavior, errors, or issues before connecting to the live network infrastructure. After testing and monitoring, the aggregation module may be connected to the live network data feed.

Turning to FIG. 3A, the aggregation module (302) is attached to the power box (305), which is attached to the pole (308). The pole (308) is formed as a light pole and includes the light (310) and the antenna (312).

Turning to FIG. 3B, the power box (305) is shown attached to the pole (308) without the aggregation module (302) of FIG. 3A. The power box (305) is secured to the pole (308) with the clamps (315) and (318).

Turning to FIG. 3C, the power box (320) is shown. A door to the power box (320) is removed to reveal the alternating current (AC) panel (322). The AC panel (322) includes the circuit breakers (325) that protect the electrical equipment connected to the pole (308) of FIG. 3A from overcurrents, short circuits, electrical faults, etc. The power box (320) also includes the indicators (328). The indicators (328) may be light emitting diodes that indicate status of power to the power box (320).

Turning to FIG. 3D, the aggregation module (302) is attached to the power box (305), which is attached to the pole (308). The aggregation module (302) is mounted to the power box (305) using the bracket (330). The bracket (330) has a width substantially (e.g., within ten percent) equal to that of the aggregation module (302) and the power box (305). The bracket (330) is mounted between the power box (305) and the pole (308) to position the aggregation module (302) above the power box (305).

Figure 4B:
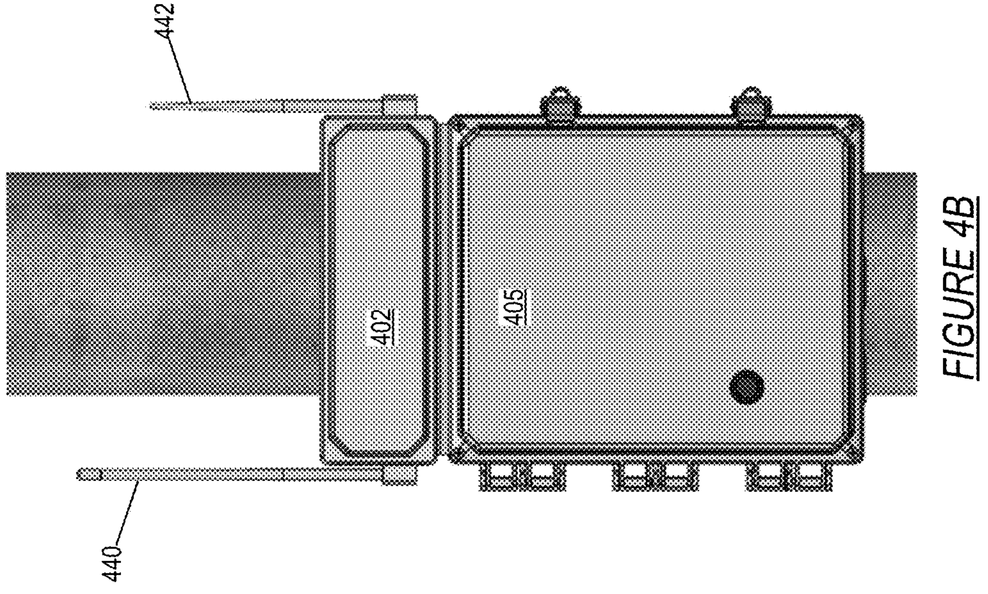
Figure 4A:
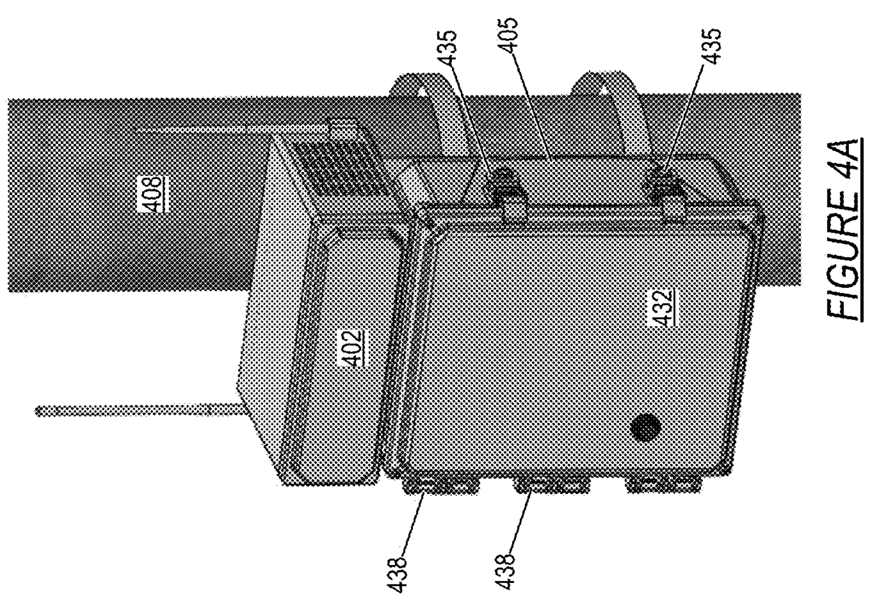

Turning to FIG. 4A, a perspective view is shown of the aggregation module (402) attached to the power box (405), which is attached to the pole (408). The cover (432) of the power box (405) protects a front face of the power box (405). The cover (432) is movably secured to the power box (405) with the latches (435) and the hinges (438).

Turning to FIG. 4B, a front view is shown of the aggregation module (402) attached to the power box (405). The aggregation module (402) includes the antennas (440) and (442). The antennas (440) and (442) may be different types, be in accordance with different communication standards, and be connected to different plug-in cards within the aggregation module (402).

Figure 5C:
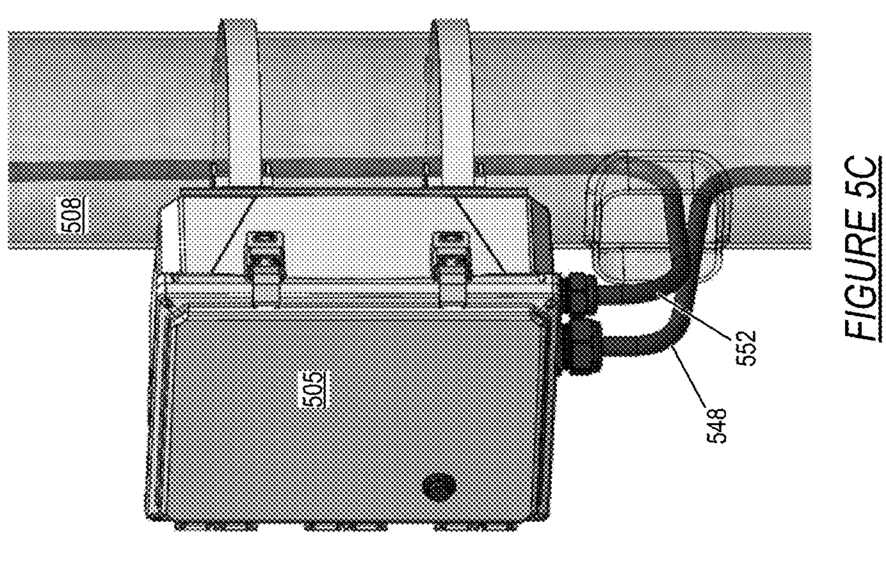
Figure 5B:
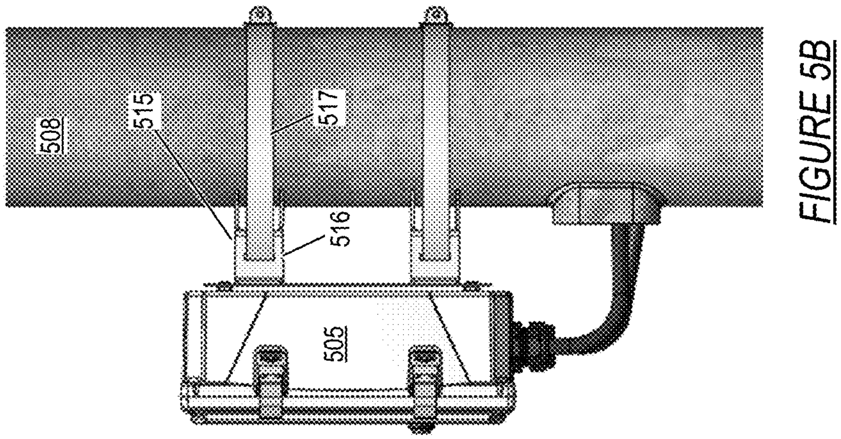
Figure 5A:
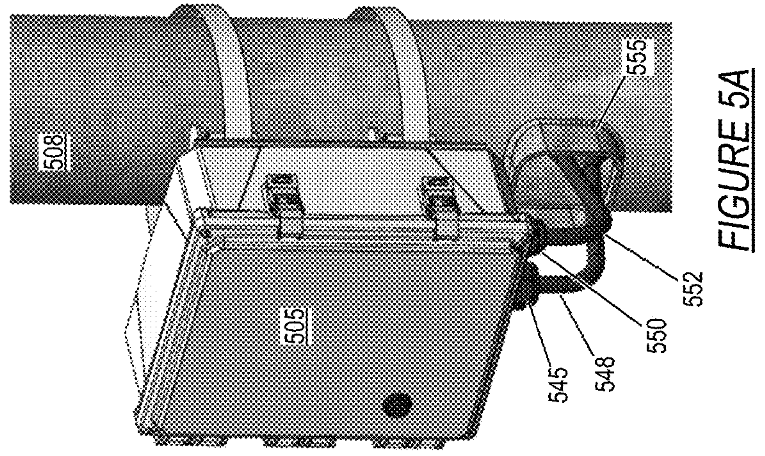

Turning to FIG. 5A, a perspective view is shown of the power box (505) attached to the pole (508). The cables (548) and (552) are connected to the power box (505) through the cable glands (545) and (550), respectively, and extend into the pole (508) through the hole (555).

Turning to FIG. 5B, a side view is shown of the power box (505) attached to the pole (508). The cable clamp (515) includes the bracket (516) and the strap (517). The power box (505) is fastened to the bracket (516), which is strapped to the pole (508) using the strap (517).

Turning to FIG. 5C, a perspective view is shown of the power box (505) attached to the pole (508). The pole (508) is shown partially transparent. The cable (548) extends into the pole (508) and runs down to a base of the pole (508). The cable (552) extends into the pole (508) and runs up towards a top of the pole (508) to be connected to additional components, e.g., a light, an antenna, etc.

Turning to FIG. 6A, a perspective view is shown of the aggregation module (602) attached to the power box (605), which is attached to the pole (608). The cables (648) and (652) pass through the cable glands (645) and (650) to connect to the power box (605). Additionally, the cable (660) connects to the power box (605) through the cable gland (658) and extends into the pole (608) through the hole (655). The pole (608) includes the hole (662), which is located behind the power box (605).

Turning to FIG. 6B, a side view is shown of the aggregation module (602), the power box (605), and the pole (608). The pole (608) is shown partially transparent.

Turning to FIG. 6C, a rear perspective view is shown of the aggregation module (602), the power box (605), and the pole (608) (shown partially transparent). The cables (652), (648), and (660) pass through the cable glands (650), (645), and (658), respectively. The cable (660) extends into the pole (608) through the hole (655), out of the pole (608) through the hole (662), and into the aggregation module (602) through the cable gland (665). The cable gland (668) passes the cable (675), which extends into the pole (608) through the hole (662) and runs down to a base of the pole (608). The cable gland (670) passes the cable (678), which also extends into the pole (608) through the hole (662) and runs down to a base of the pole (608). The cable gland (672) passes the cable (680), which extends into the pole (608) through the hole (662) and runs towards a top of the pole (608).

The bracket (630) is secured to the power box (605) with multiple fasteners, including the fastener (631). The bracket (630) extends along a back side of the power box (605) and provides the shelf (632) and the hem (633) to support the aggregation module (602).

Figure 7B:
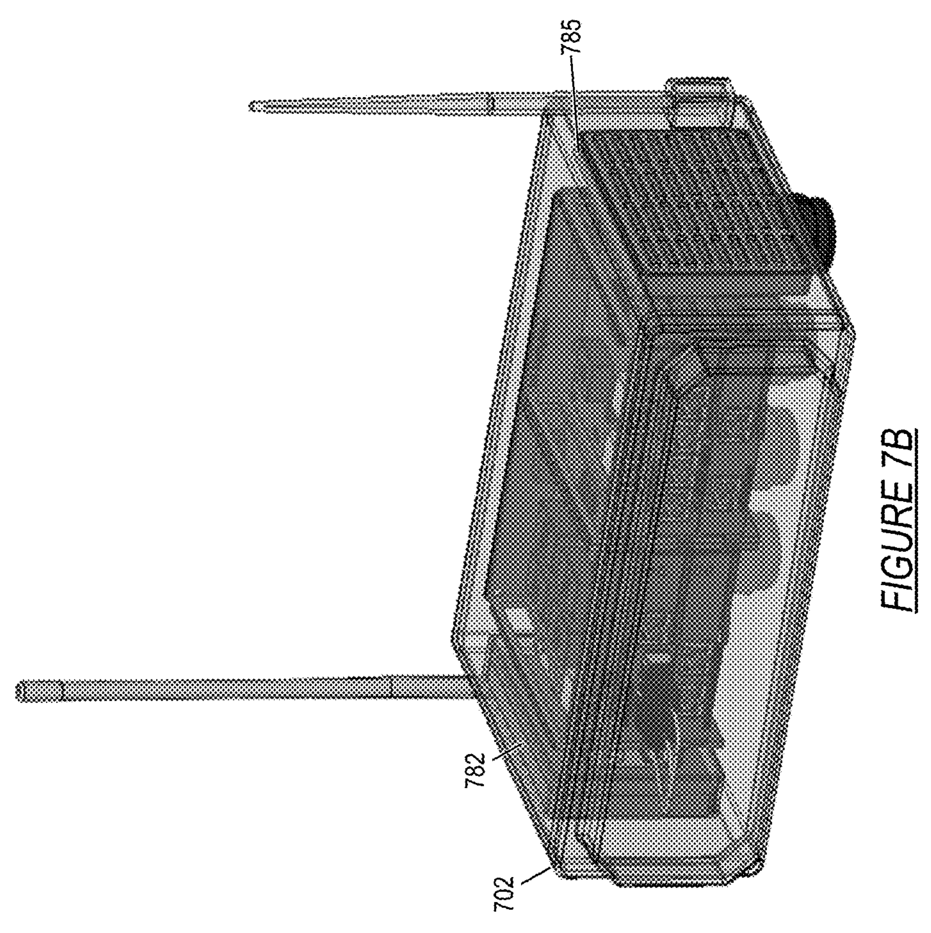
Figure 7A:
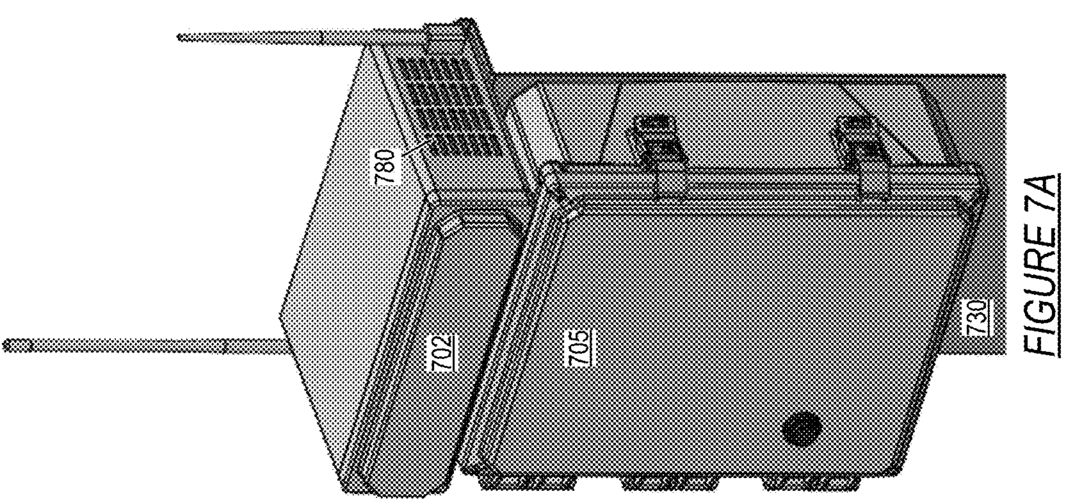

Turning to FIG. 7A, the aggregation module (702) and the power box (705) are secured to the bracket (730). The bracket (730) extends below the power box (705) and may be used to secure additional modules, boxes, equipment etc. The aggregation module (702) includes the vents (780) to provide a path for outside air to flow through the aggregation module (702).

Turning to FIG. 7B, the aggregation module (702) is shown with a partially transparent housing and front panel. The aggregation module (702) includes a cooling system that includes the modules (782) and (785). In one embodiment, the modules (782) and (785) include fans to cool the components within the aggregation module (702) using outside air.

Figure 8:
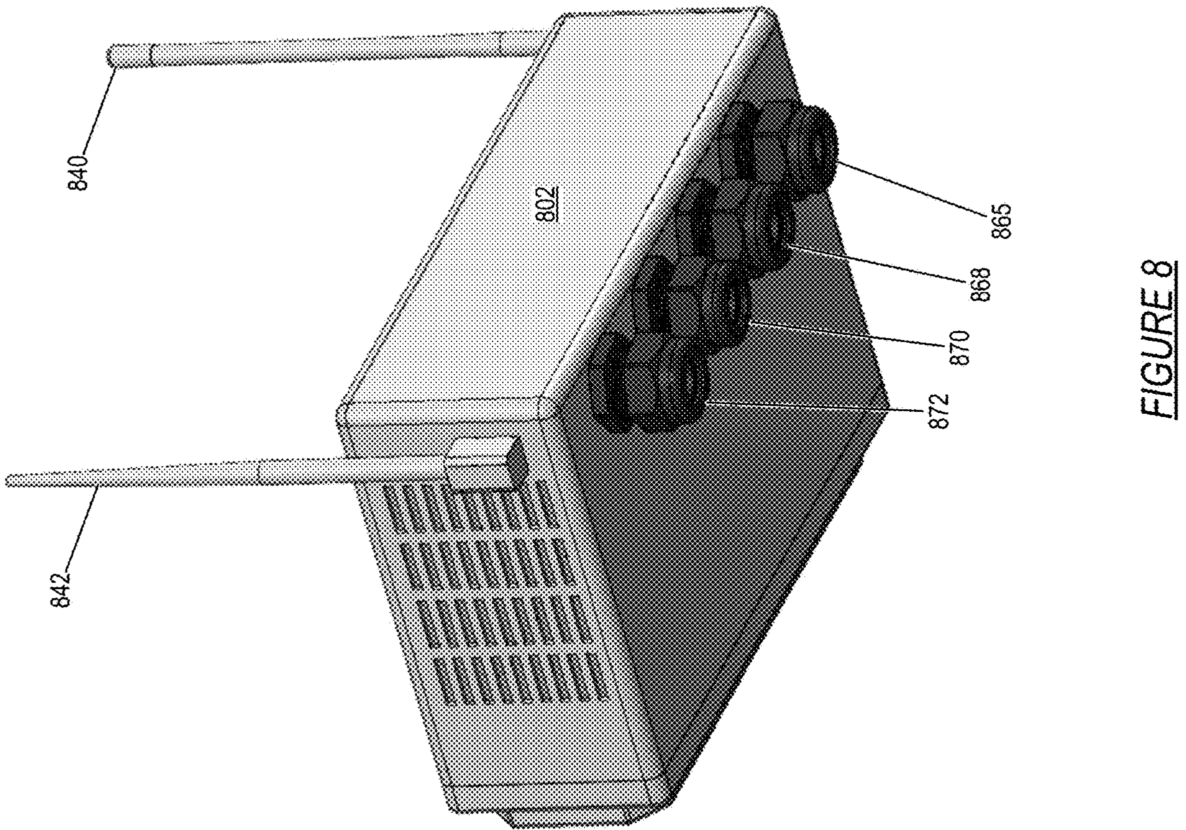

Turning to FIG. 8, the aggregation module (802) is shown from a bottom rear perspective. The aggregation module (802) includes the cable glands (865), (868), (870), and (872) to has cables into and out of the aggregation module (802). The aggregation module (802) also includes the antennas (840) and (842). In one embodiment, the antenna (840) may be for a wireless area network (WAN) with communication ranges of about 100 to 300 feet (30 to 90 meters). In one embodiment, the antenna (842) may be for a low power long range wide area network (e.g., LoRaWAN) with ranges of 1 to 10 kilometers (0.6 to 6.2 miles). Different antennas and corresponding equipment may be used.

Figure 9B:
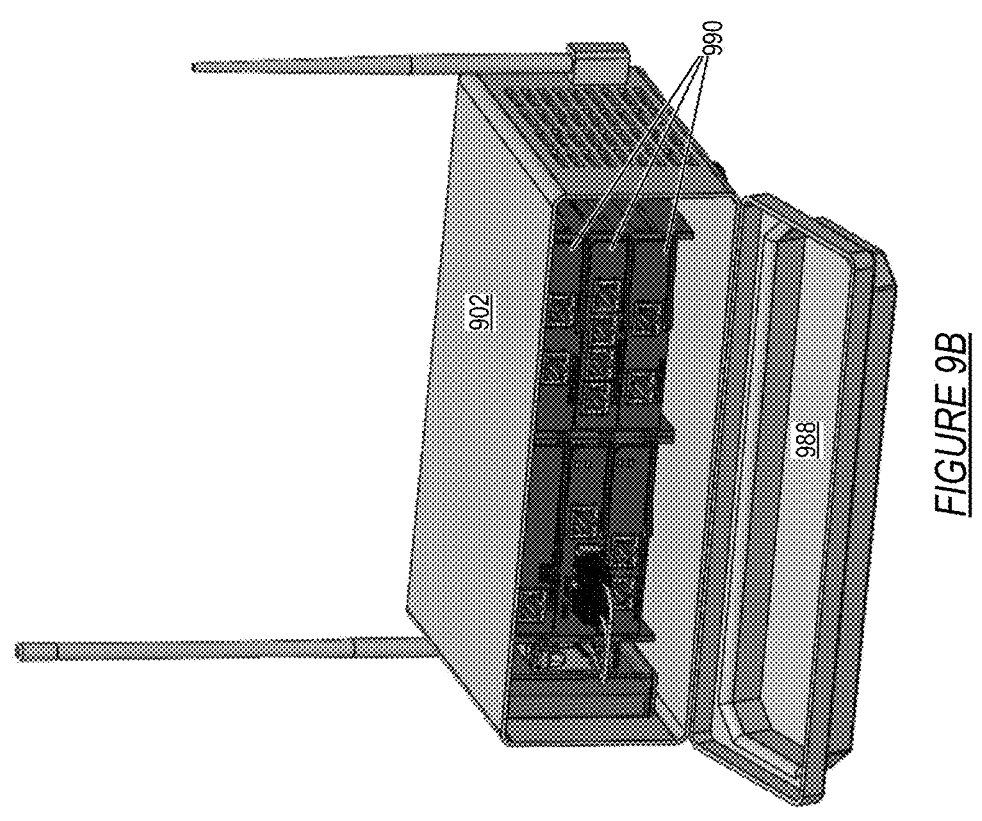
Figure 9A:
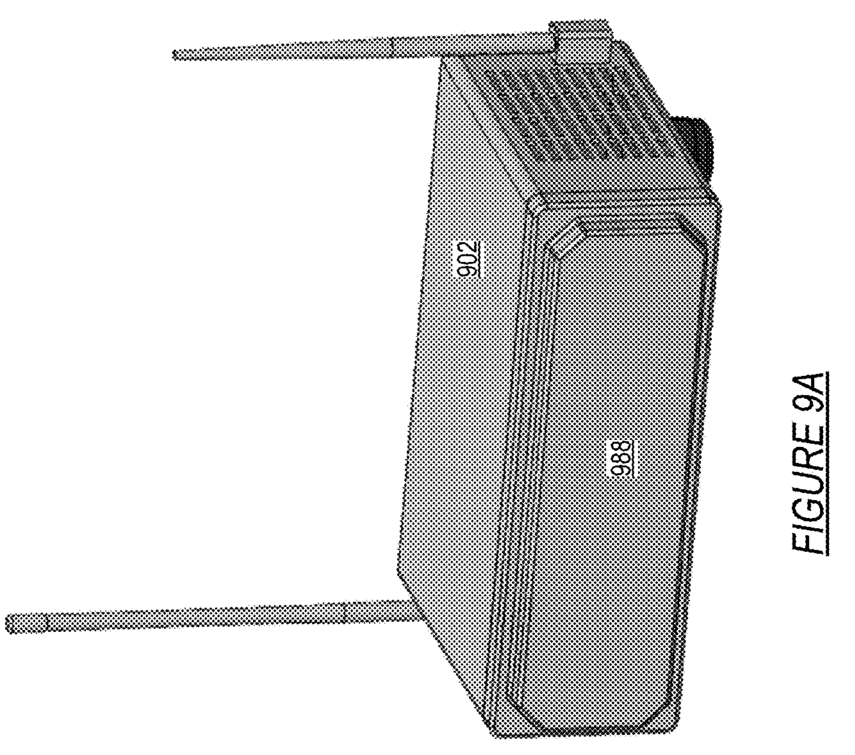

Turning to FIG. 9A, the aggregation module (902) is shown. The aggregation module (902) includes the front access panel (988) in a closed position.

Turning to FIG. 9B, the aggregation module (902) is shown with the front access panel (988) in an open position. The r902 aggregation module (902) includes the plug-in cards (990).

Figure 10:
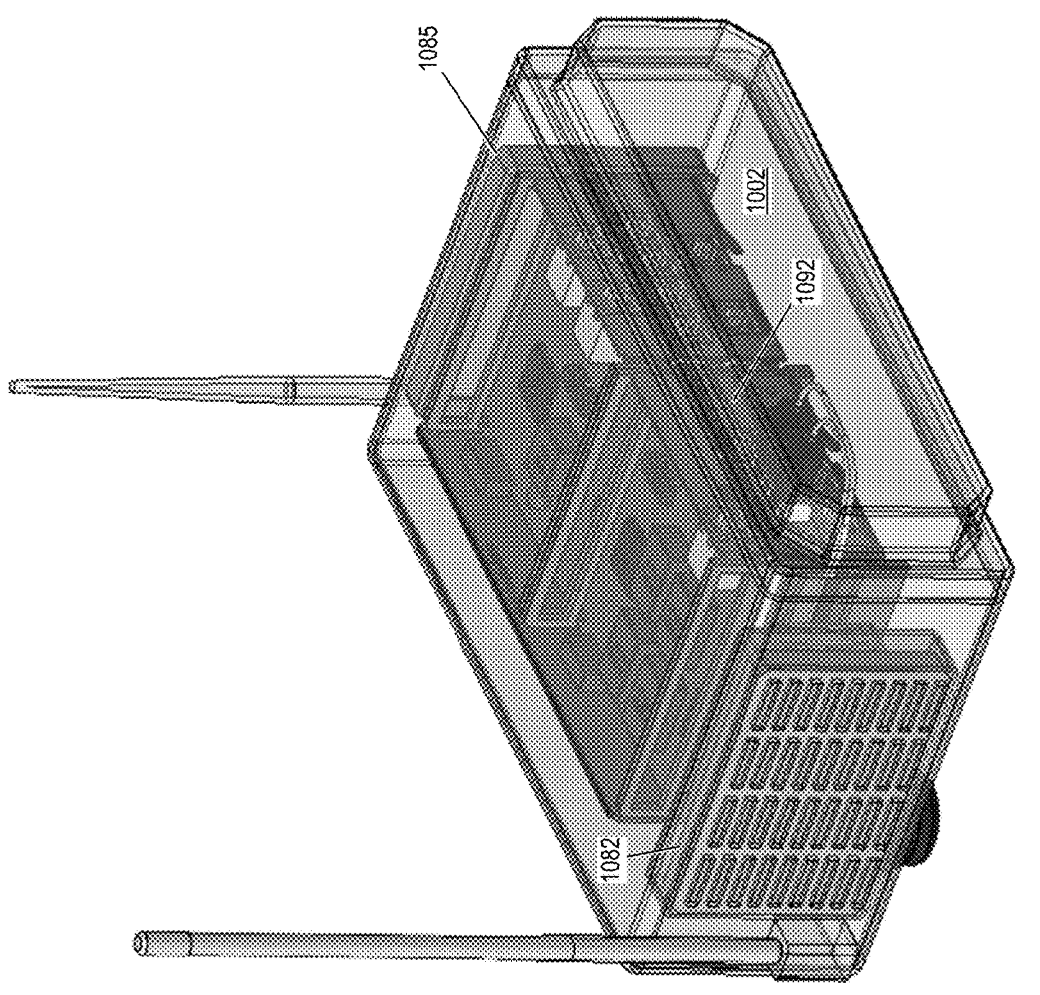

Turning to FIG. 10, the aggregation module (1002) is shown. The aggregation module (1002) includes the plug-in card (1092), which may be a small form factor pluggable (SFP) transceiver that is a hot-swappable optical or electrical module used in networking and telecommunications equipment. The aggregation module (1002) also includes the modules (1082) and (1085).

The modules (1082) and (1085) form a cooling system. The module (1082) may be an intake component to pull in outside air with the module (1085) being an exhaust component to push inside air to the outside environment.

Figure 11:
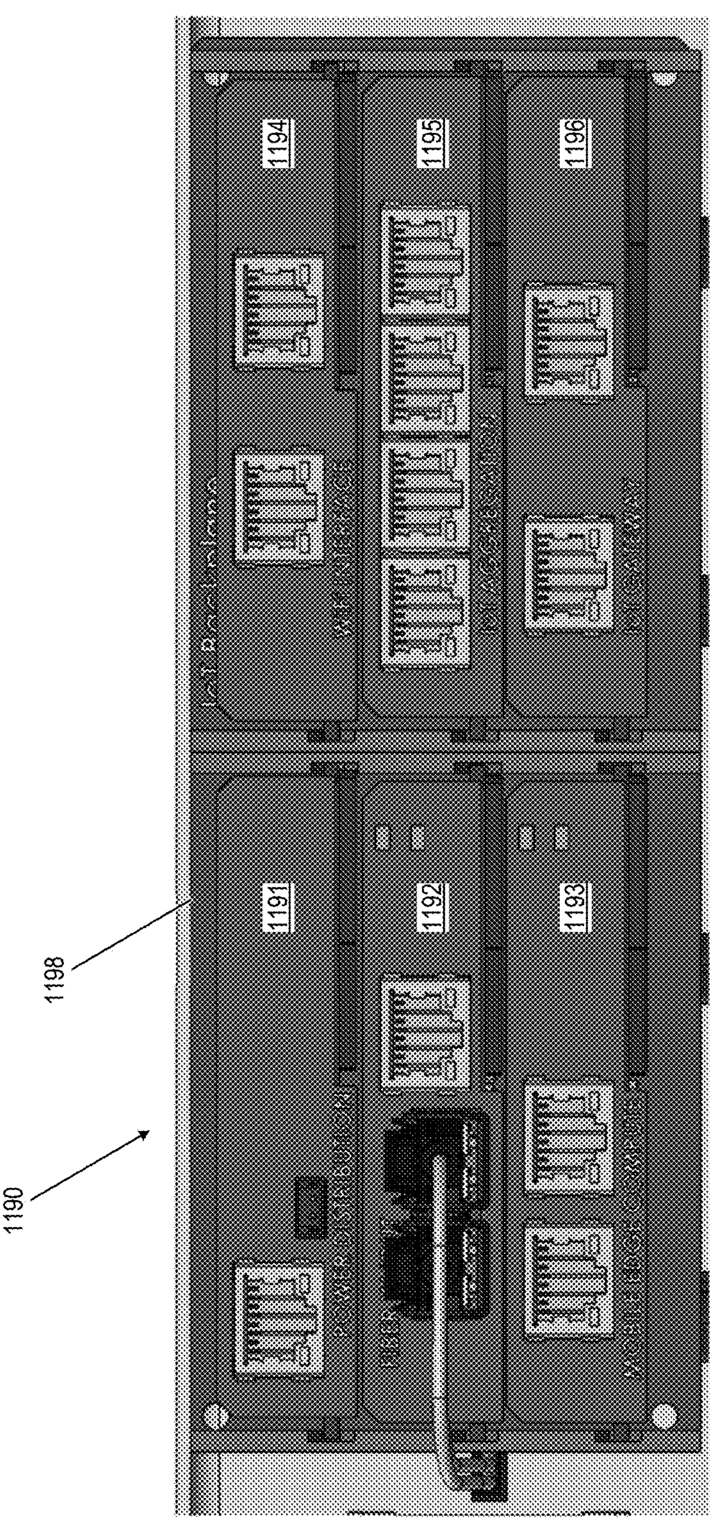

Turning to FIG. 11, a partial front view of an aggregation model is shown to reveal the plug-in cards (1190) within. The plug-in cards (1190) are inserted into the backplane (1198) and include the individual plug-in cards (1191), (1192), (1193), (1194), (1195), and (1196). In one embodiment, the plug-in card (1191) is a power distribution card that distributes power within the aggregation module. In one embodiment, the plug-in card (1192) is an SFP transceiver. In one embodiment, the plug-in card (1193) is a mobile edge compute card that provides computing resources (e.g., processing power) to execute software applications. In one embodiment, the plug-in card (1194) is a wireless interface card to enable wireless connectivity and allow the components of the aggregation module to connect to wireless (e.g., "Wi-Fi") networks, access the internet, and communicate with other devices wirelessly. In one embodiment, the plug-in card (1195) is an internet of things (IoT) aggregation card that aggregates information from other IoT devices that may be installed at a cell site. In one embodiment, the plug-in card (1196) is an IoT gateway card that serves as an intermediary between IoT devices (sensors, actuators, etc.) that wirelessly communicate with the aggregation module.

Figure 12:
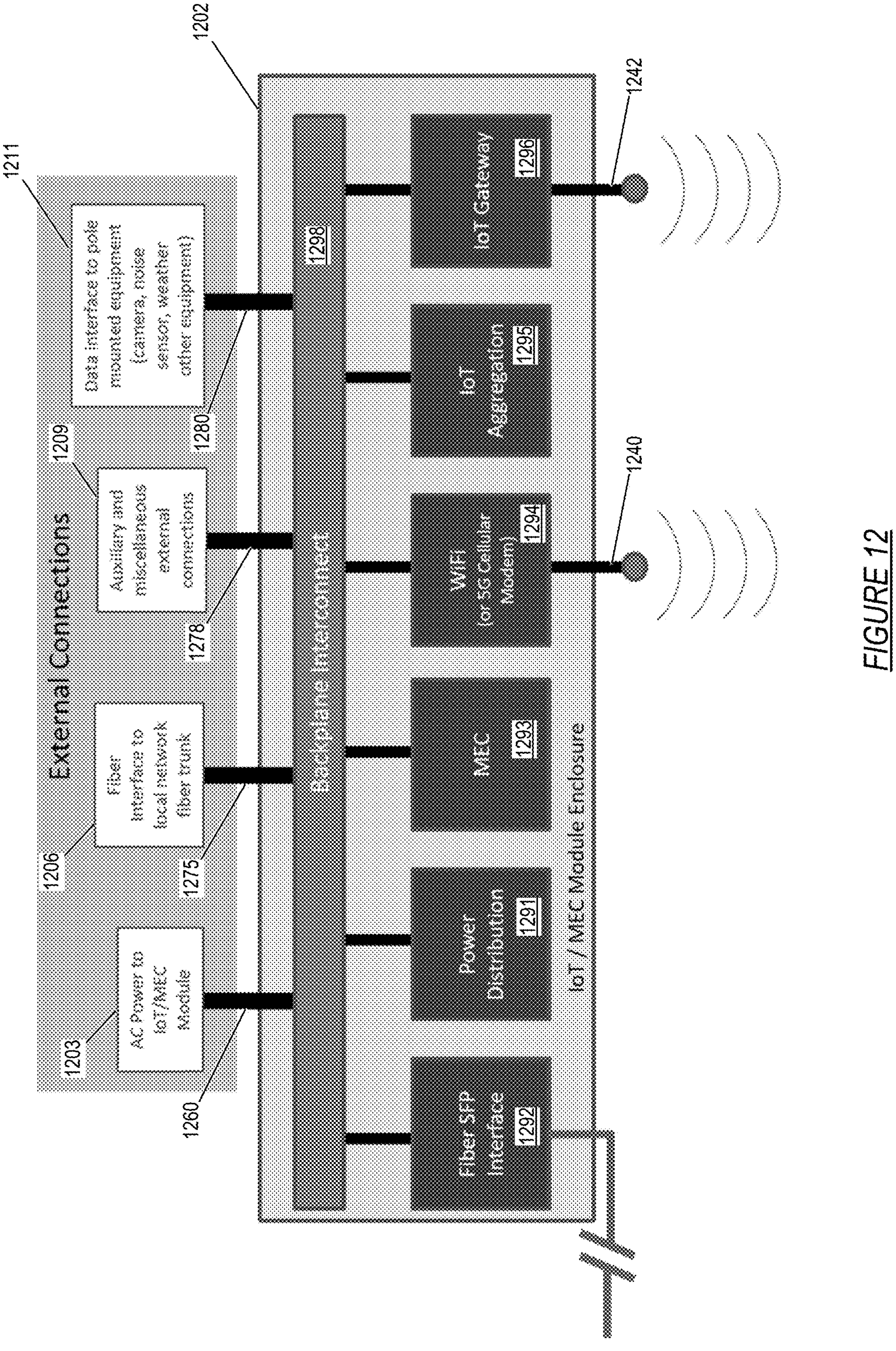

Turning to FIG. 12, a functional block diagram of an aggregation module is illustrated. The aggregation module (1202) includes the plug-in cards (1291), (1292), (1293), (1294), (1295), and (1296), which may be similar to the plug-in cards (1191), (1192), (1193), (1194), (1195), and (1196) of FIG. 11. The plug-in cards (1294) and (1296) are respectively connected to the antennas (1240) and (1242), which may be similar to the antennas (840) and (842) of FIG. 8. The aggregation module (1202) includes the backplane (1298), which connects to the plug-in cards (1291), (1292), (1293), (1294), (1295), and (1296) and to the cables (1260), (1275), (1278), and (1280). The cables (1260), (1275), (1278), and (1280) may be similar to the cables (660), (675), (678), and (680) of FIG. 6C and connect the aggregation module (1202) to the external connections (1203), (1206), (1209), and (1211). The external connection (1203) may be to a power box to provide power (e.g., alternating current (AC) power) to the aggregation module (1202). The external connection (1206) is a fiber interface to a local network fiber trunk. The external connection (1209) is an auxiliary connection. The external connection (1211) is a data interface to other equipment mounted on the pole to which the aggregation module (1202) is attached.

Figures 13A, 13B:
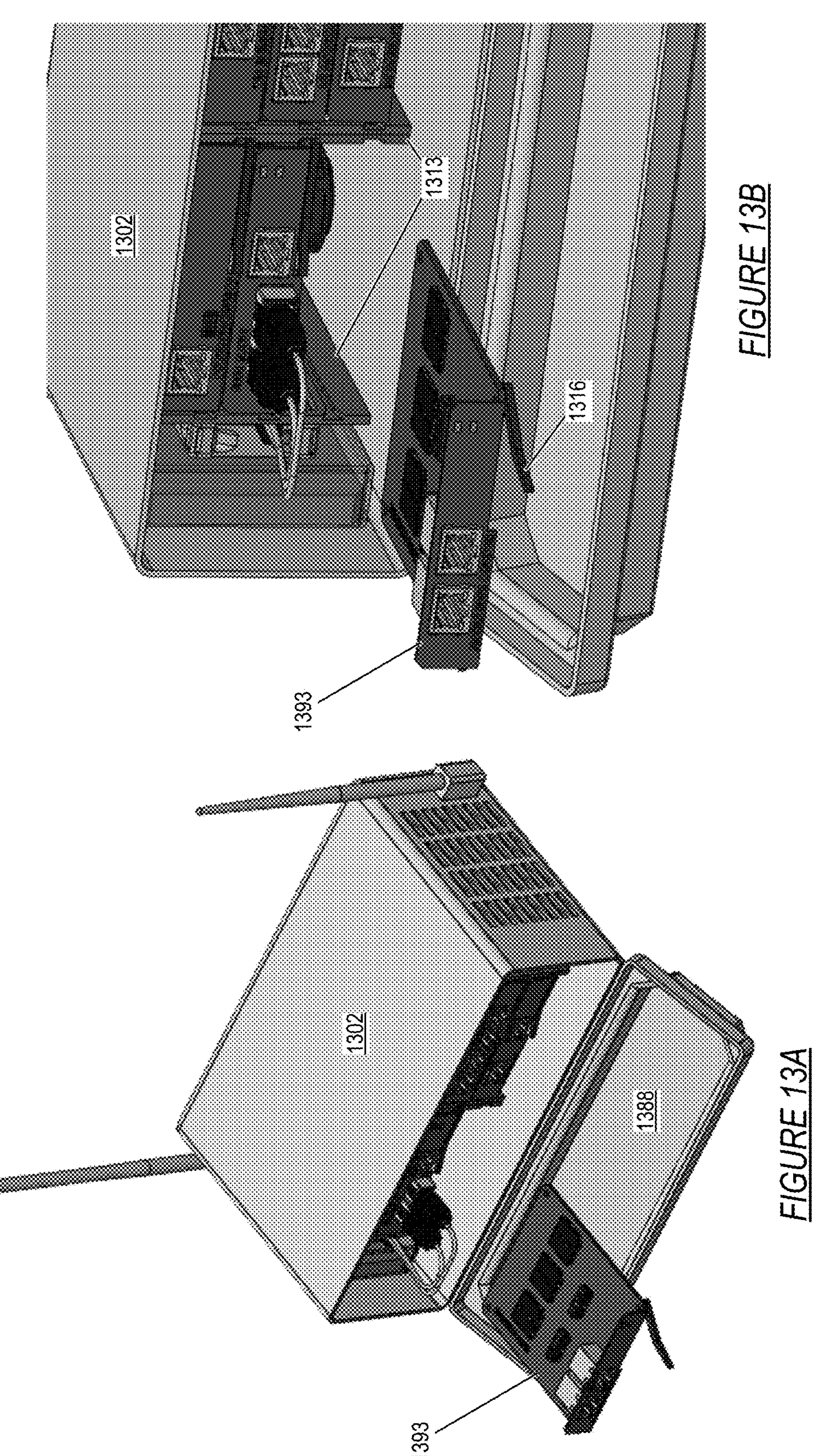

Turning to FIG. 13A, an upper perspective view of the aggregation module (1302) is shown with the front access panel (1388) in an open position. The plug-in card (1393) is shown prior to insertion into the aggregation module (1302).

Turning to FIG. 13B, a front perspective view of the aggregation module (1302) is shown. The plug-in card (1393) includes the lever (1316). The lever (1316) is an insertion and ejection lever that, when manipulated, may provide a force to insert or eject the card to and from the support structure (1313) of the aggregation module (1302). The support structure (1313) organizes the interior of the aggregation module (1302) into six slots with three horizontal layers and two vertical layers. The horizontal layers are orthogonal to the vertical layers. The insertion direction for the plug-in card (1393) is orthogonal to both the horizontal layers and the vertical layers formed by the support structure (1313).

Figure 14:
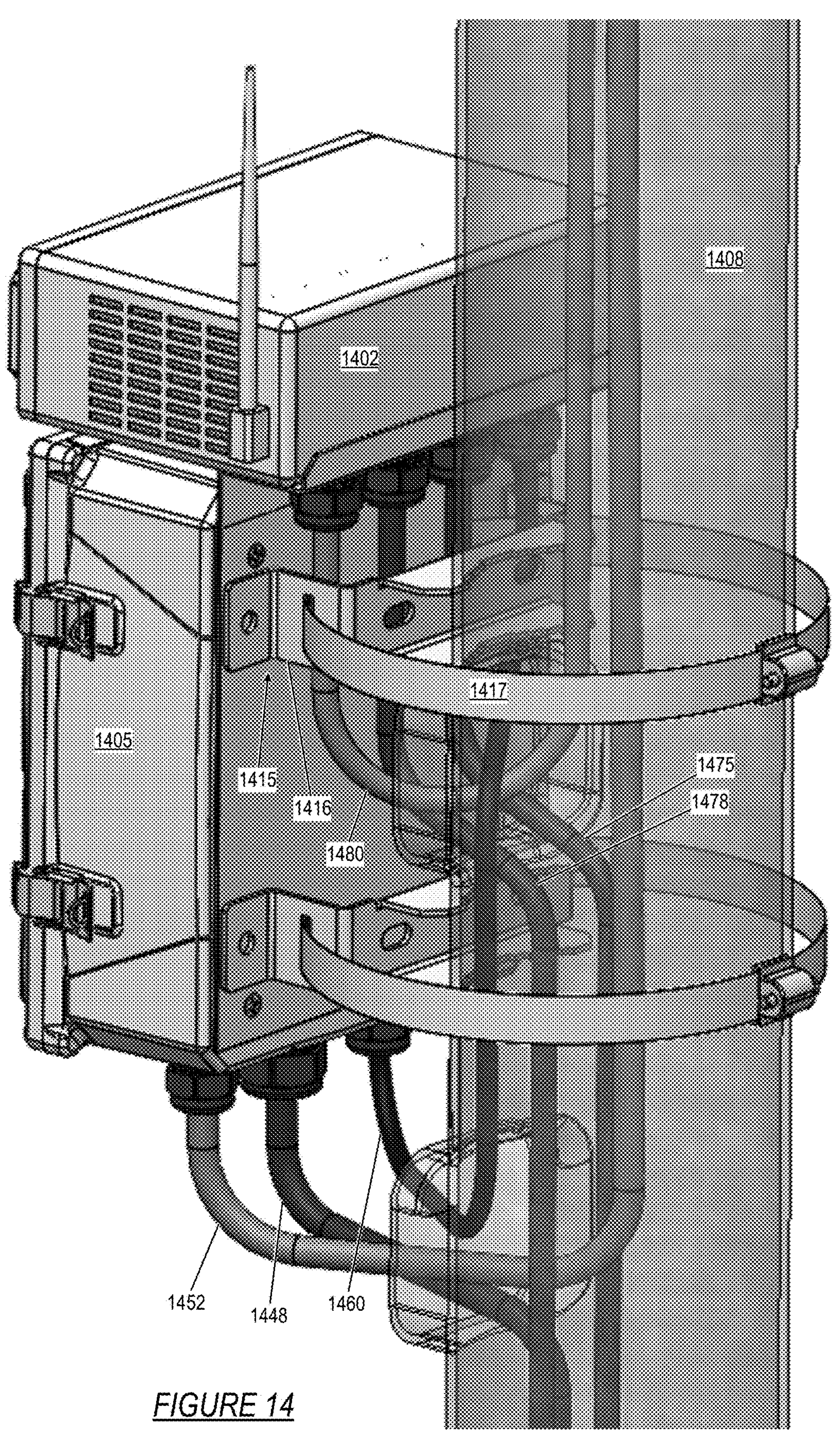

Turning to FIG. 14, the aggregation module (1402) is mounted to the power box (1405), which is mounted to the pole (1408). The pole clamp (1415) includes the bracket (1416) and the strap (1417). The bracket (1416) forms a cable raceway to manage the cables (1460), (1475), (1478), and (1480). The cable (1480) is part of a data interface to pole mounted equipment (camera, noise sensor, weather sensor, etc.). The cables (1475) and (1478) connect the aggregation module (1402) to a local fiber trunk cable and to second cable, which may be optional. The cable (1460) connects between the aggregation module (1402) and the power box (1405) to supply power to the aggregation module (1402). The cable (1452) supplies power from the power box (1405) to radios and other equipment at the top of the pole (1408). The cable (1448) supplies power to the power box (1405).

Figure 15B:
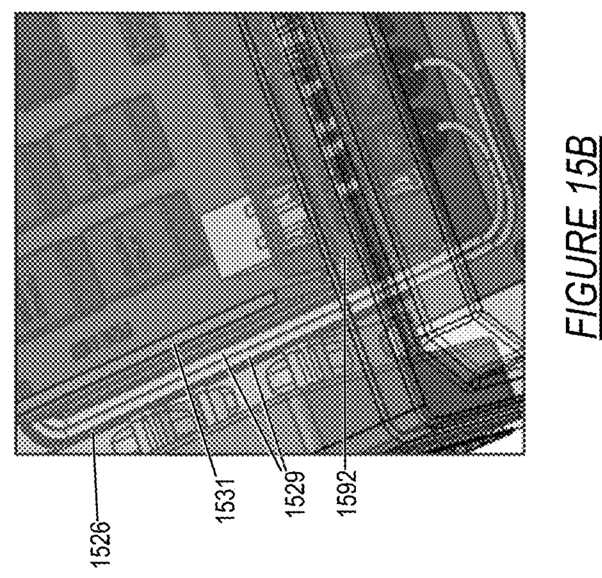
Figure 15A:
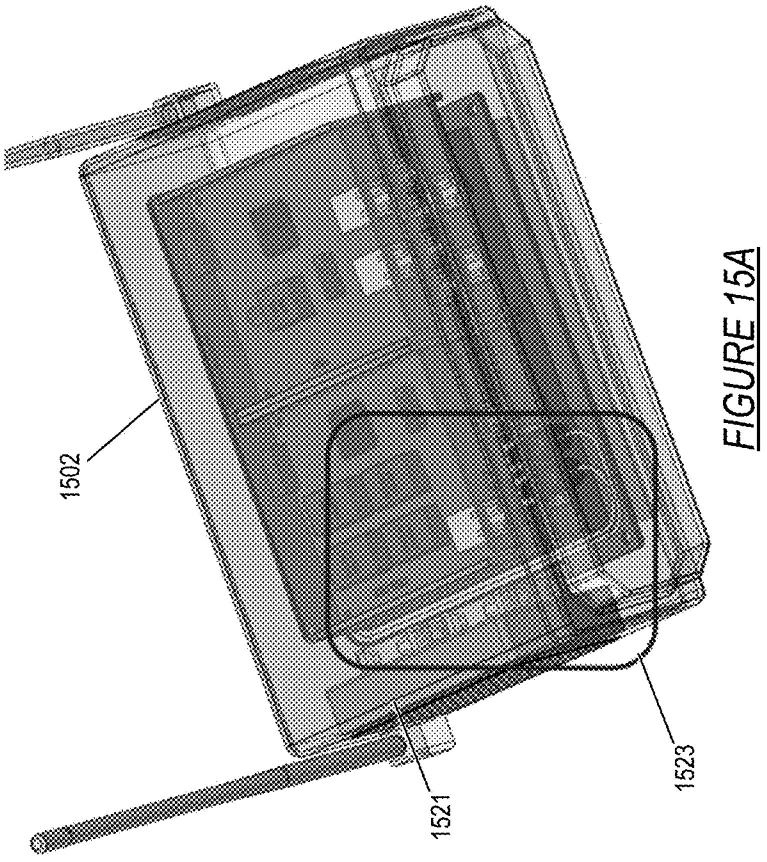

Turning to FIG. 15A, the aggregation module (1502) is shown with a partially transparent exterior. The aggregation module (1502) includes the module (1521), which forms a cooling system to draw air through the aggregation module (1502). The module (1521) is on one side of the aggregation module (1502) and the opposite side of the aggregation module (1502) includes passive vents without an active fan. The view (1523) is shown in FIG. 15B and illustrates additional detail within the aggregation module (1502).

Turning to FIG. 15B, a view of the inside of the aggregation module (1502) of FIG. 15A is shown, which corresponds to the view (1523) of FIG. 15A. The raceway bracket (1526) is a fiber routing guide for the optical fibers (1529). The fibers (1529) wrap around from a backside of the interior of the aggregation module (1502) of FIG. 15A along the support structure (1531) to a front side where the fibers (1529) are connected to the plug-in card (1592).

Figure 16B:
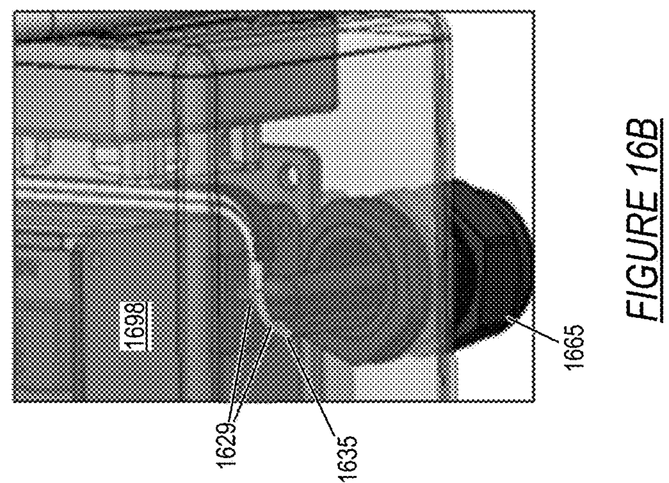
Figure 16A:
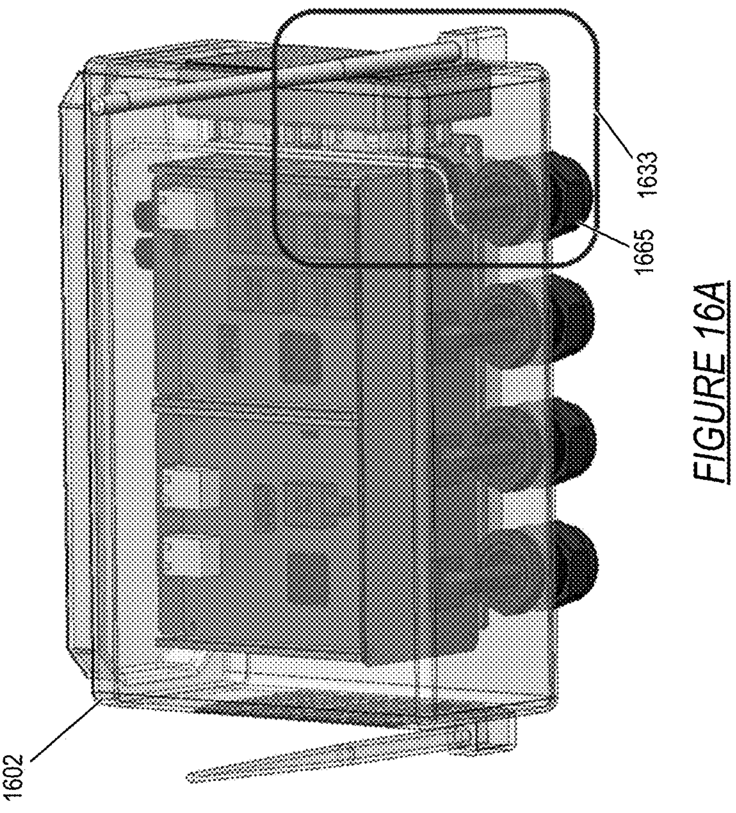

Turning to FIG. 16A, a rear view of the aggregation module (1602) is it shown with a partially transparent exterior. The aggregation module (1602) includes the cable gland (1665). The view (1633) is shown in FIG. 16B and illustrates additional detail within the aggregation module (1602).

Turning to FIG. 16B, a view of the inside of the aggregation module (1602) of FIG. 16A is shown, which corresponds to the view (1633) of FIG. 16A. The optical fibers (1629) wrap around the backplane (1698) and extend into the cable gland (1665). At the transition (1635), the optical fibers (1629) transition to using outdoor rated tubing.

Figures 17A, 17B:
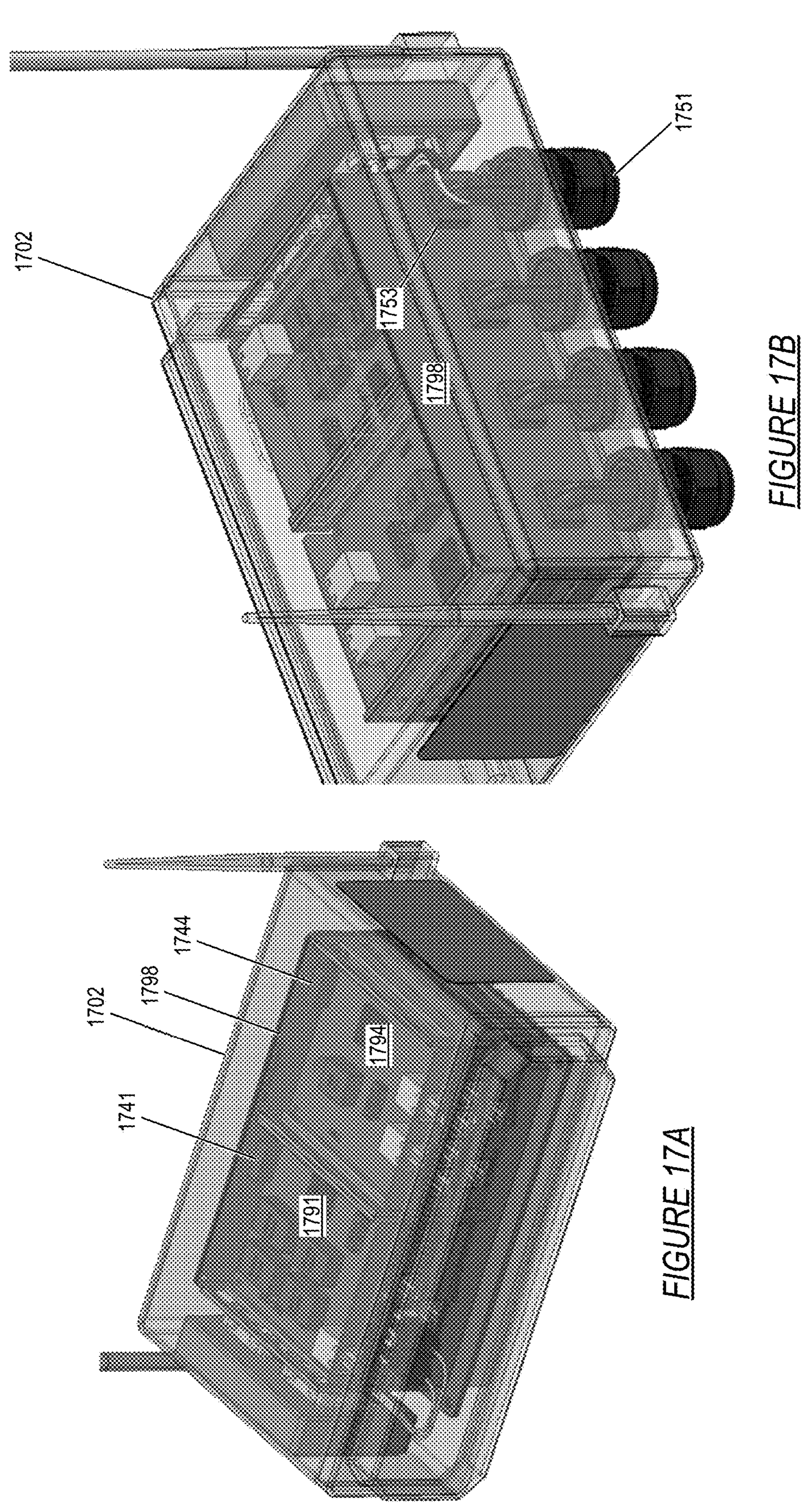

Turning to FIG. 17A, an upper front perspective of the aggregation module (1702) is shown. The aggregation module (1702) includes the front side connectors (1741) and (1744) into which the plug-in cards (1791) and (1794) are inserted. The front side connectors (1741) and (1744) include power and data connections.

Turning to FIG. 17B, an upper rear perspective of the aggregation module (1702) is shown. The backplane (1798) includes a backside connector that is covered with the environmental seal (1753), which extends into the cable gland (1751). The environmental seal (1753) protects the backside connector of the backplane (1798) from environmental contaminants.

Figure 18:
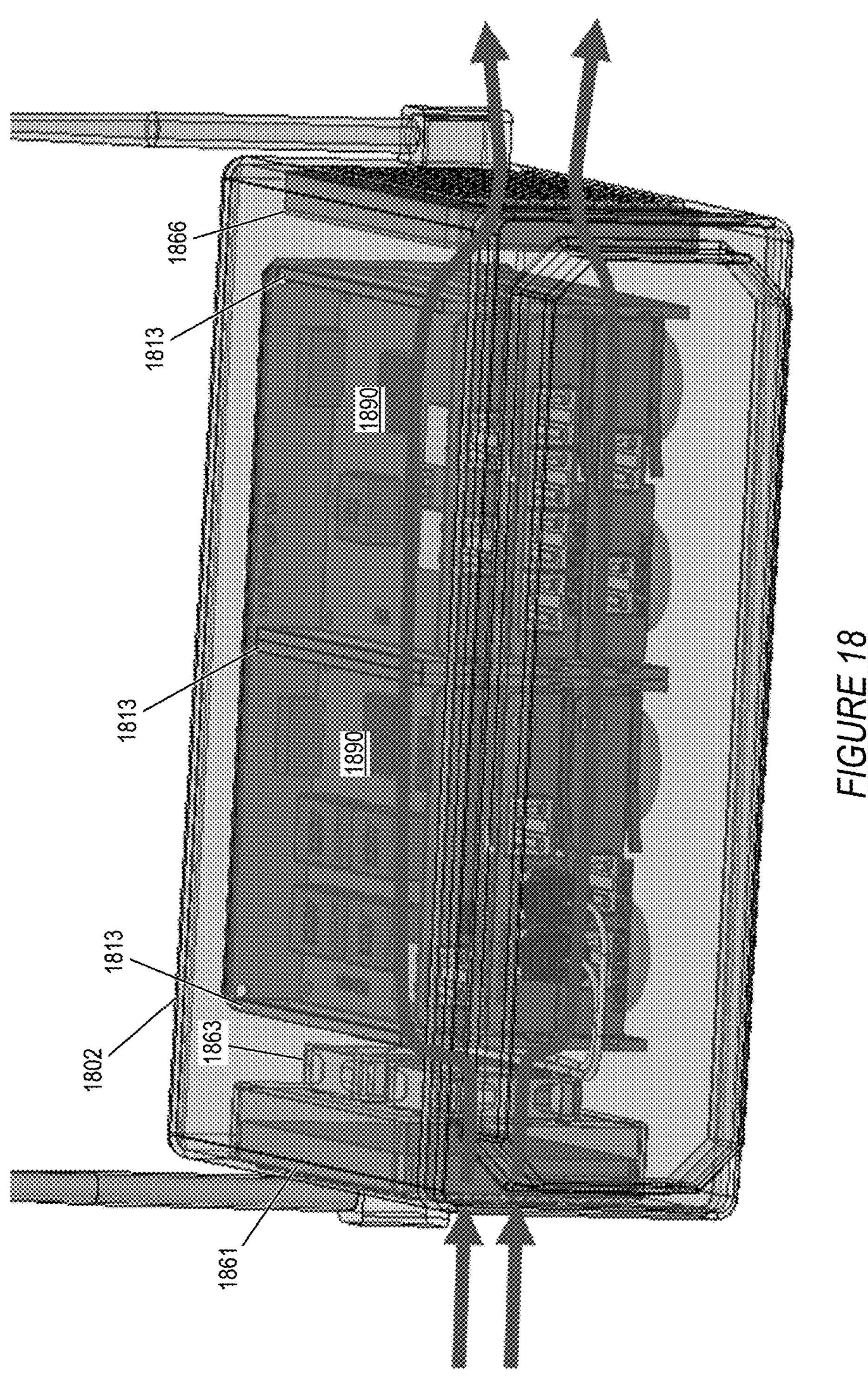

Turning to FIG. 18, an upper front perspective of the aggregation module (1802) is shown that includes a cooling system. The cooling system includes the ingress filter (1861), the fans (1863), at the egress filter (1866). The ingress filter (1861) filters outside air entering the aggregation module (1802). The fans (1863) draw air through the aggregation module (1802). The egress filter (1866) filters the air from within the aggregation module (1802) before returning outside. The support structure (1813) in combination with the plug-in cards (1890) create horizontal layers within the aggregation module (1802) to establish an airflow path with an airflow direction flowing from the ingress filter (1861) through the fans (1863) and out the egress filter (1866).

Figure 19:
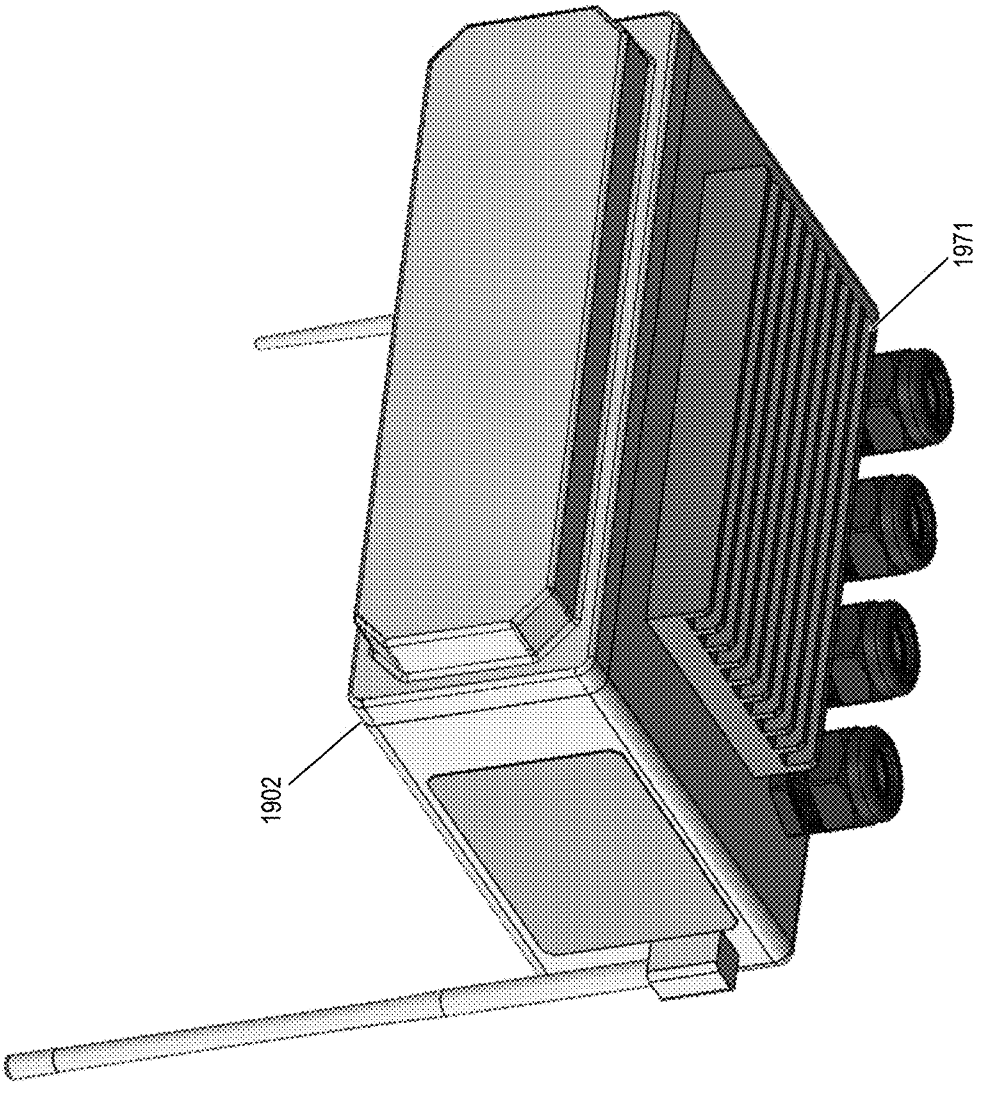

Turning to FIG. 19, an upper front perspective of the aggregation module (1902) is shown that includes a cooling system. The cooling system includes the external fins (1971) for ambient heat rejection that radiate heat from the aggregation module (1902) to the environment outside of the aggregation module (1902). The cooling system of the aggregation module (1902) may circulate air within the aggregation module (1902) without drawing outside air into the aggregation module (1902).

Figure 20:
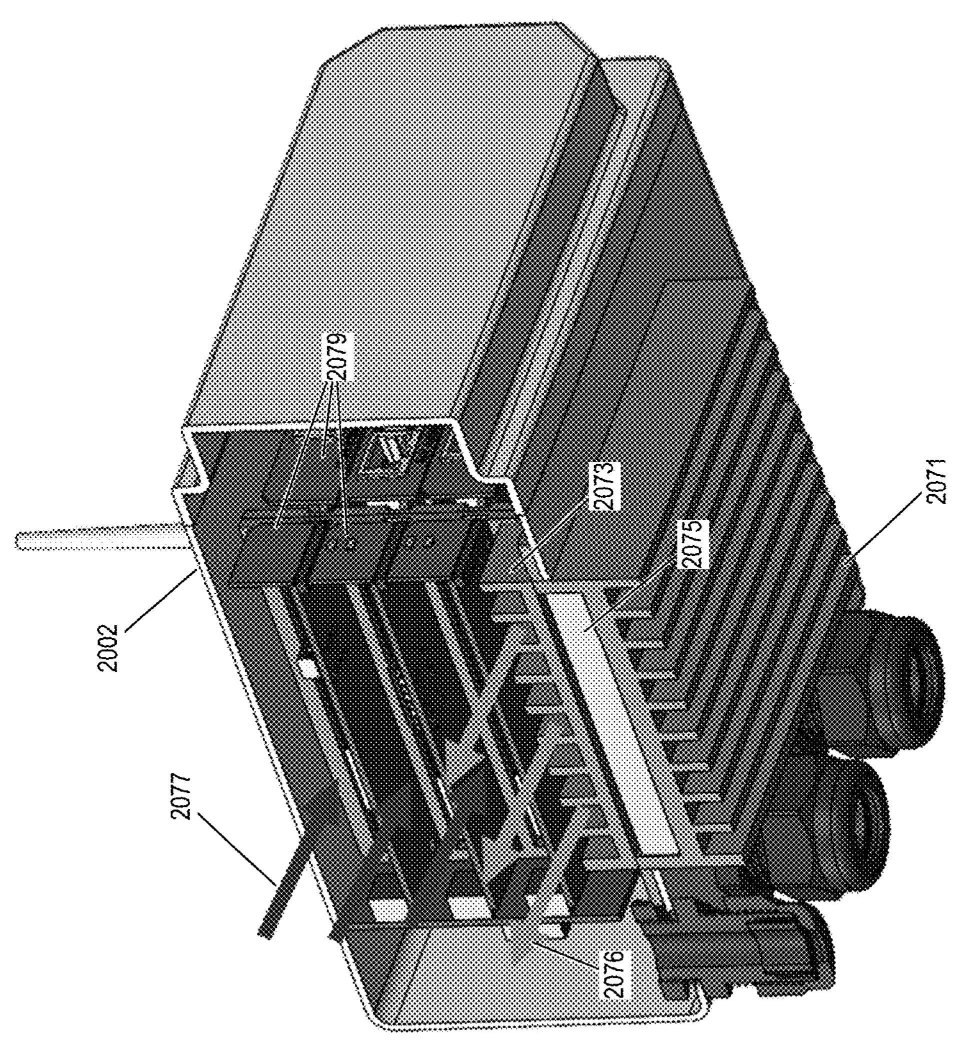

Turning to FIG. 20, a side cutaway view of the aggregation module (2002) is shown. The cooling system of the aggregation module (2002) includes the external fins (2071) and the internal fins (2073). The internal fins (2073) capture heat to form the cool air (2076) flowing over the internal fins (2073). The plug-in cards (2090) generate heat that forms the hot air (2077). The airflow direction over the plug-in cards (2090) is opposite to the airflow direction through the internal fins (2073).

The cooling system of the aggregation module (2002) includes the phase change material (2075) between the internal fins (2073) and the external fins (2071). The phase change material (2075) holds a substantially constant temperature during a month cycle. The melt time for the phase change material (2075) corresponds to the volume of the phase change material (2075), the melting temperature of the phase change material (2075), the heat load of the aggregation module (2002), cooling effectiveness of the fins and fans of the cooling system, etc.

Figure 21:
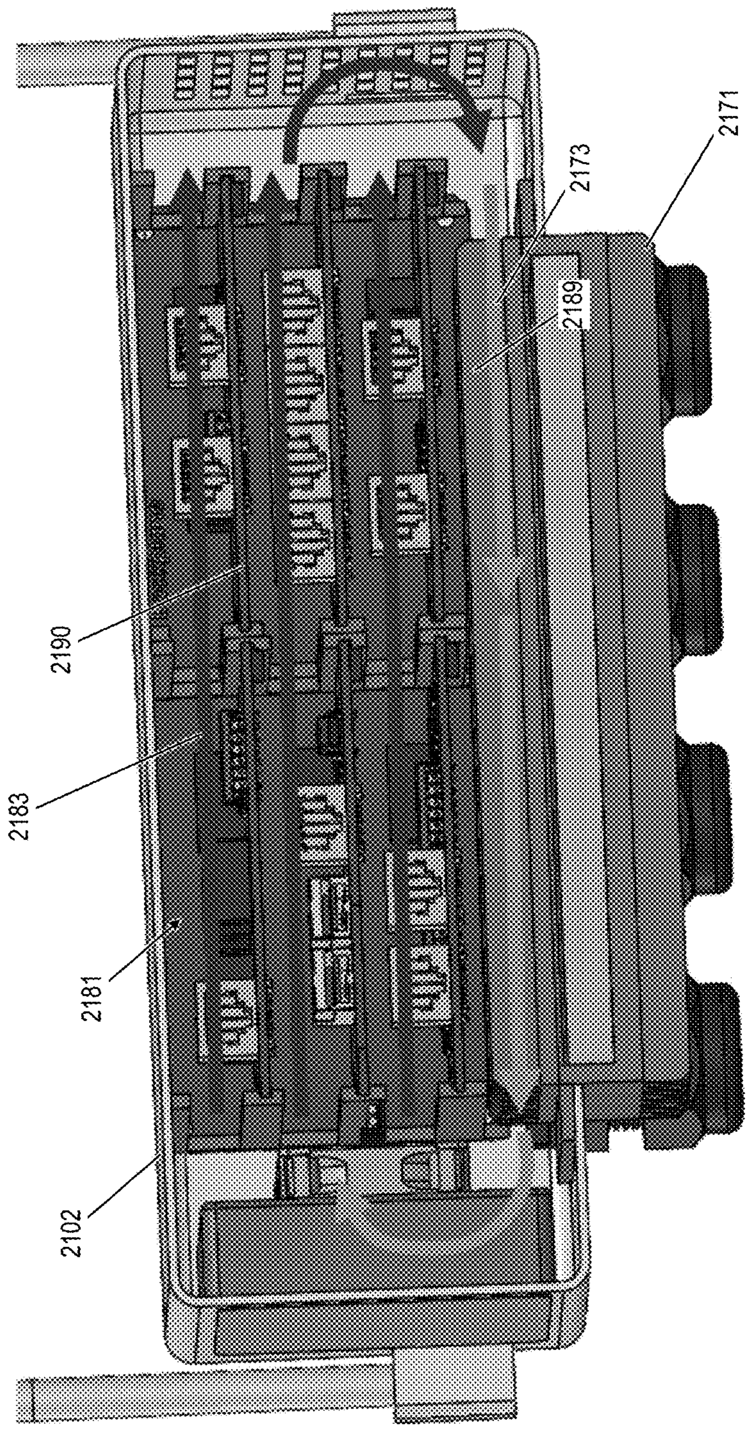

Turning to FIG. 21, a front cutaway view of the aggregation module (2102) is shown. The airflow path (2181) includes the hot airflow through the plug-in cards (2190) and the cool airflow through the internal fins (2173), which transfers heat captured from inside of the aggregation module (2102) to the external fins (2171).

Figure 22B:
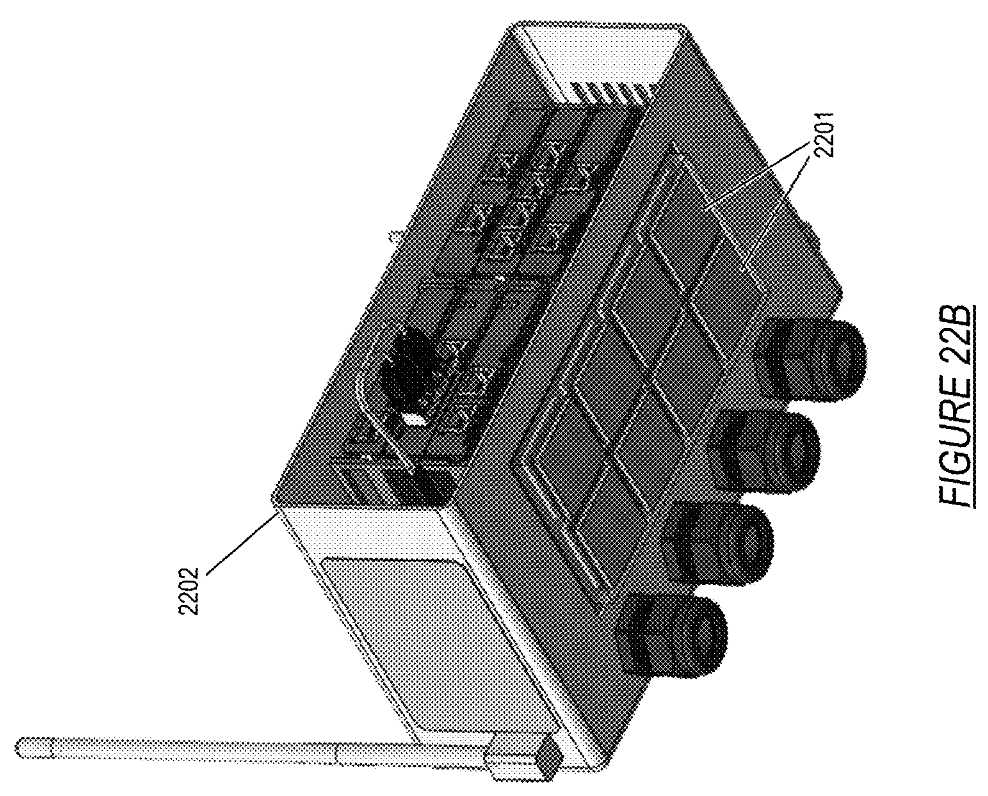
Figure 22A:
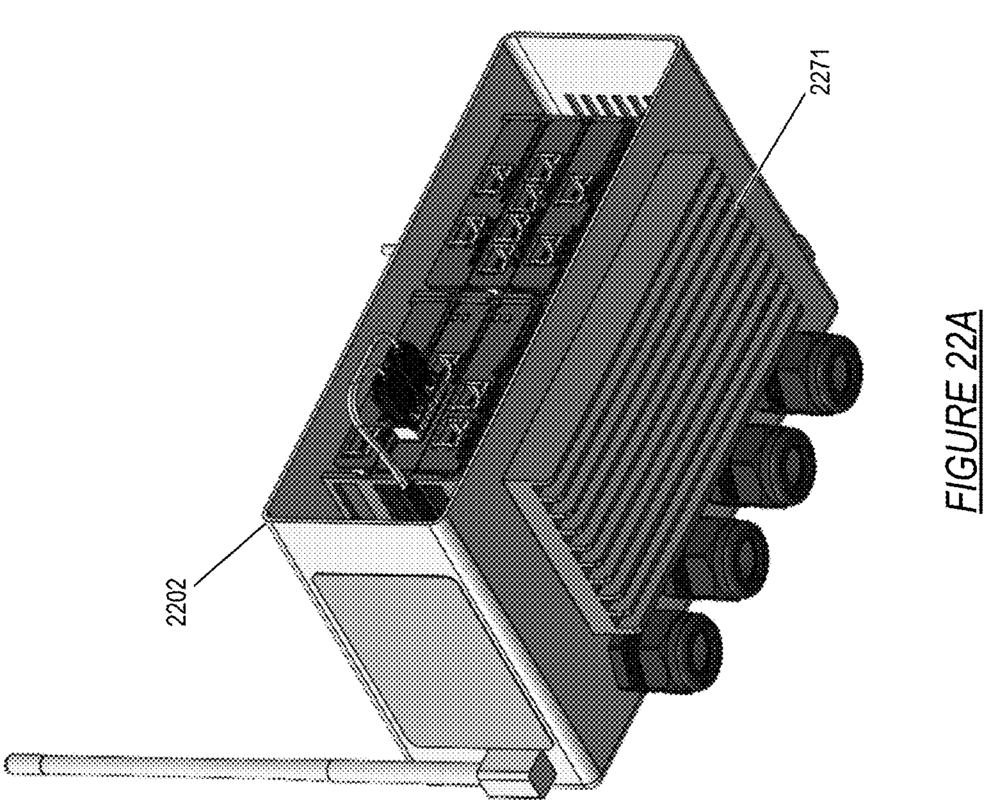

Turning to FIG. 22A, a front cutaway view of the aggregation module (2202) is shown. The aggregation module (2202) includes a cooling system with the external fins (2271).

Turning to FIG. 22B, the aggregation module (2202) is shown after removal of the external fins (2271) of FIG. 22A to reveal the thermoelectric cooling devices (2201). The thermoelectric cooling devices (2201) transfer heat from the interior of the aggregation module (2202) to the external fins (2271) of FIG. 22A.

Figure 23:
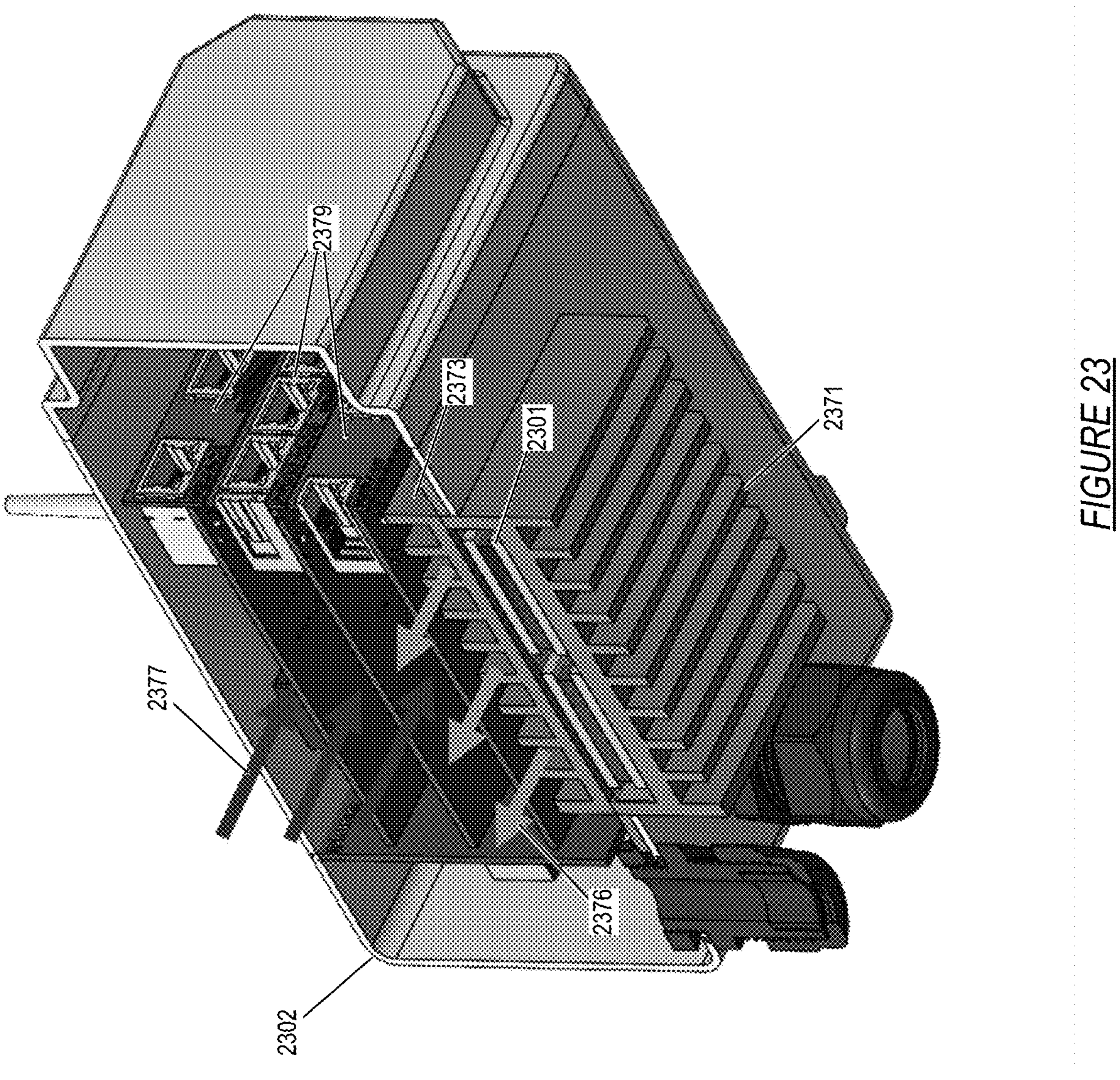

Turning to FIG. 23, a side cutaway view of the aggregation module (2302) is shown. The cooling system of the aggregation module (2302) includes the external fins (2371), the thermoelectric cooling devices (2301), and the internal fins (2373). Additionally, the cooling system of the aggregation module (2302) may include one or more fans to force airflow through the interior of the aggregation module (2302). The thermoelectric cooling devices (2301) uses electricity to bias the transfer of heat from the side of the thermoelectric cooling devices (2301) contacting the internal fins (2373) to the side of the thermoelectric cooling devices (2301) contacting the external fins (2371). Transferring the heat to the external fins (2371) cools the internal fins (2373), which cools the air flowing through the internal fins (2373). The cool air (2376) is routed to flow past the plug-in cards (2390), removing heat from the plug-in cards (2390), informing the hot air (2377). The hot air (2377) is routed back through to the internal fins (2373) to repeat the cooling cycle.

Figure 24B:
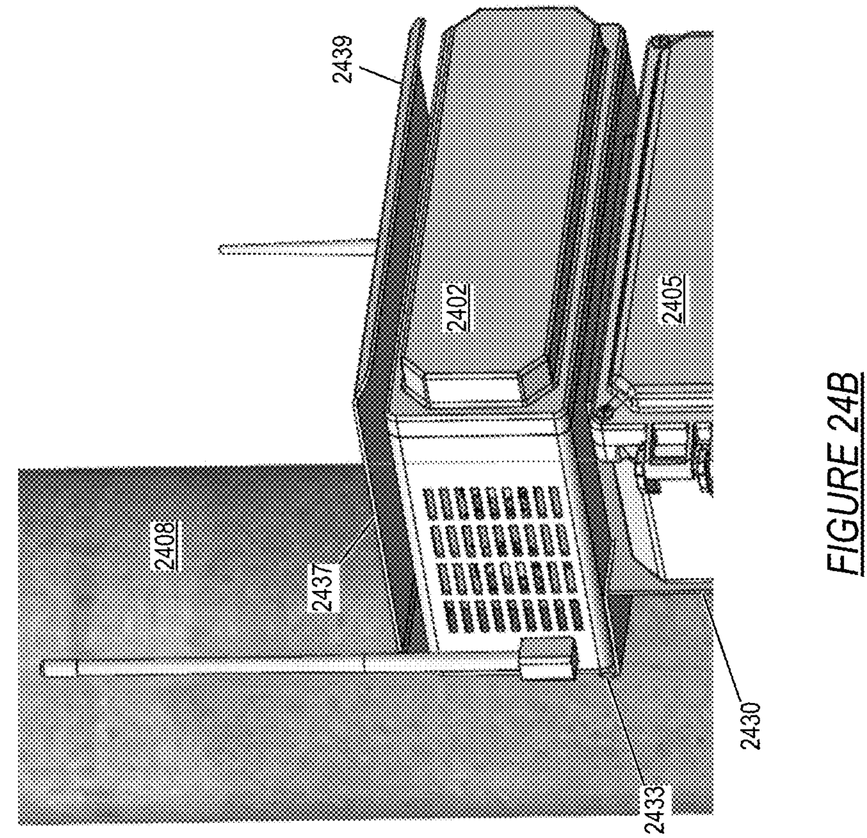
Figure 24A:
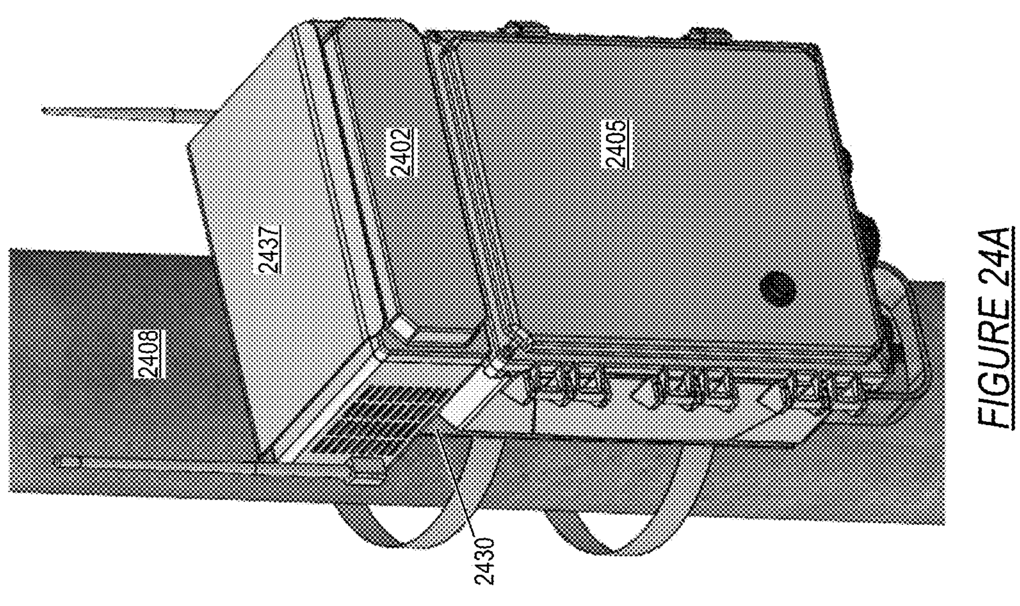

Turning to FIG. 24A, the aggregation module (2402) is mounted to the power box (2405), which is mounted to the pole (2408). The aggregation module (2402) is secured to the power box (2405) with the bracket (2430). The bracket (2430) includes the solar shield (2437) to reduce the solar heat load on the aggregation module (2402).

Turning to FIG. 24B, the aggregation module (2402) is mounted to the power box (2405), which is mounted to the pole (2408). The bracket (2430) includes the hem (2433) to which the solar shield (2437) may be affixed. The solar shield (2437) includes the flange (2439).

Embodiments of the disclosure may be implemented on a computing system specifically designed to achieve an improved technological result. When implemented in a computing system, the features and elements of the disclosure provide a significant technological advancement over computing systems that do not implement the features and elements of the disclosure. Any combination of mobile, desktop, server, router, switch, embedded device, or other types of hardware may be improved by including the features and elements described in the disclosure. For example, as shown in FIG. 25A, the computing system (2500) may include one or more computer processors (2502), non-persistent storage device(s) (2504), persistent storage device (s) (2506), a communication interface (2512) (e.g., Bluetooth interface, infrared interface, network interface, optical interface, etc.), and numerous other elements and functionalities that implement the features and elements of the disclosure. The computer processor(s) (2502) may be an integrated circuit for processing instructions. The computer processor(s) may be one or more cores or micro-cores of a processor. The computer processor(s) (2502) includes one or more processors. The one or more processors may include a central processing unit (CPU), a graphics processing unit (GPU), a tensor processing units (TPU), combinations thereof, etc.

The input devices (2510) may include a touchscreen, keyboard, mouse, microphone, touchpad, electronic pen, or any other type of input device. The input devices (2510) may receive inputs from a user that are responsive to data and messages presented by the output devices (2508). The inputs may include text input, audio input, video input, etc., which may be processed and transmitted by the computing system (2500) in accordance with the disclosure. The communication interface (2512) may include an integrated circuit for connecting the computing system (2500) to a network (not shown) (e.g., a local area network (LAN), a wide area network (WAN) such as the Internet, mobile network, or any other type of network) and/or to another device, such as another computing device.

Further, the output devices (2508) may include a display device, a printer, external storage, or any other output device. One or more of the output devices may be the same or different from the input device(s). The input and output device(s) may be locally or remotely connected to the computer processor(s) (2502). Many different types of computing systems exist, and the aforementioned input and output device(s) may take other forms. The output devices (2508) may display data and messages that are transmitted and received by the computing system (2500). The data and messages may include text, audio, video, etc., and include the data and messages described above in the other figures of the disclosure.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments, which may include transmitting, receiving, presenting, and displaying data and messages described in the other figures of the disclosure.

The computing system (2500) in FIG. 25A may be connected to or be a part of a network. For example, as shown in FIG. 25B, the network (2520) may include multiple nodes (e.g., node X (2522), node Y (2524)). Each node may correspond to a computing system, such as the computing system shown in FIG. 25A, or a group of nodes combined may correspond to the computing system shown in FIG. 25A. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (2500) may be located at a remote location and connected to the other elements over a network.

The nodes (e.g., node X (2522), node Y (2524)) in the network (2520) may be configured to provide services for a client device (2526), including receiving requests and transmitting responses to the client device (2526). For example, the nodes may be part of a cloud computing system. The client device (2526) may be a computing system, such as the computing system shown in FIG. 25A. Further, the client device (2526) may include and/or perform all or a portion of one or more embodiments.

The computing system of FIG. 25A may include functionality to present raw and/or processed data, such as results of comparisons and other processing. For example, presenting data may be accomplished through various presenting methods. Specifically, data may be presented by being displayed in a user interface, transmitted to a different computing system, and stored. The user interface may include a GUI that displays information on a display device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

As used herein, the term "connected to" contemplates multiple meanings. A connection may be direct or indirect (e.g., through another component or network). A connection may be wired or wireless. A connection may be temporary, permanent, or semi-permanent communication channel between two entities.

The various descriptions, features, and elements of the figures may be combined and may include or be included within the features described in the other figures of the application. Similarly named features and elements between different figures may refer to the same feature or element. The various elements, systems, components, and steps shown in the figures may be omitted, repeated, combined, and/or altered as shown from the figures. Accordingly, the scope of the present disclosure should not be considered limited to the specific arrangements shown in the figures.

In the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, unless expressly stated otherwise, the word "or" is an "inclusive or" and, as such includes "and." Further, items joined by an or may include any combination of the items with any number of each item unless expressly stated otherwise.

In the above description, numerous specific details are set forth in order to provide a more thorough understanding of the disclosure. However, it will be apparent to one of ordinary skill in the art that the technology may be practiced without these specific details. In other instances, well-known features have not been described in detail to avoid unnecessarily complicating the description. Further, other embodiments not explicitly described above can be devised which do not depart from the scope of the claims as disclosed herein. Accordingly, the scope should be limited only by the attached claims.

What is claimed is:

1. An apparatus forming an aggregation module, the apparatus comprising:

a support structure to support a plurality of plug-in cards, wherein the plurality of plug-in cards is insertable along an insertion direction;

wherein the support structure organizes an interior of the aggregation module into six slots with three horizontal layers and two vertical layers;

wherein the horizontal layers are orthogonal to the vertical layers; and wherein the insertion direction is orthogonal to both the horizontal layers and the vertical layers;

a front access panel openable to access the plurality of plug-in cards;

the support structure and the plurality of plug-in cards forming an airflow path along an airflow direction.

2. The apparatus of claim 1, further comprising:

one or more cable guides extending from a trunk side of the aggregation module to an access panel side of the aggregation module while maintaining the airflow path, wherein the airflow direction is transverse to the insertion direction.

3. The apparatus of claim 1, further comprising:

the plurality of plug-in cards comprising one or more of a fiber interface card, a power distribution card, a compute card, a tensor processing unit, a long range wireless access card, and a short range wireless access card.

4. The apparatus of claim 1, further comprising:
the support structure comprising a backplane into which the plurality of plug-in cards are plugged-in; and
the backplane comprising at least one back side connector into which at least one cable is inserted.

5. The apparatus of claim 1, further comprising:
a power box to which the aggregation module is secured; and
the power box secured to a pole of a cell site.

6. The apparatus of claim 1, further comprising:
a cable gland of the aggregation module to secure entry of a cable to the aggregation module.

7. The apparatus of claim 1, further comprising:
a cooling system comprising internal fins positioned internal to the aggregation module and external fins positioned external to the aggregation module.

8. The apparatus of claim 1, further comprising:
the support structure comprising a plurality of slots organized into a set of horizontal layers and a set of vertical layers,
wherein the horizontal layers are orthogonal to the vertical layers,
wherein a horizontal layer of the set of horizontal layers comprises at least two slots of the plurality of slots, and
wherein the vertical layer of the set of vertical layers comprises at least three slots of the plurality of slots.

9. The apparatus of claim 1, further comprising:
the airflow path in the aggregation module split between a set of horizontal layers of the support structure.

10. The aggregation module of claim 1, further comprising:
a plurality of mounting openings configured to align with corresponding mounting openings of a power box; and
one or more fasteners extendable through the aligned mounting openings to secure the aggregation module to an exterior surface of the power box;
wherein at least one of the plug-in cards comprises an insertion and ejection lever configured to provide a force to insert or eject the plug-in card relative to the support structure.

11. A system comprising:
an aggregation module comprising:
a support structure to support a plurality of plug-in cards, wherein the plurality of plug-in cards is insertable along an insertion direction;
wherein the support structure organizes an interior of the aggregation module into six slots with three horizontal layers and two vertical layers;
wherein the horizontal layers are orthogonal to the vertical layers; and
wherein the insertion direction is orthogonal to both the horizontal layers and the vertical layers;
a front access panel openable to access the plurality of plug-in cards;
the support structure and the plurality of plug-in cards forming an airflow path along an airflow direction;
a power box connected to the aggregation module; and
a pole to which the power box is secured.

12. The system of claim 11, further comprising:
one or more cable guides extending from a trunk side of the aggregation module to an access panel side of the aggregation module while maintaining the airflow path, wherein the airflow direction is transverse to the insertion direction.

13. The system of claim 11, further comprising:
the plurality of plug-in cards comprising one or more of a fiber interface card, a power distribution card, a compute card, a tensor processing unit, a long range wireless access card, and a short range wireless access card.

14. The system of claim 11, further comprising:
the support structure comprising a backplane into which the plurality of plug-in cards are plugged-in; and
the backplane comprising at least one back side connector into which at least one cable is inserted.

15. The system of claim 11, further comprising:
a power box to which the aggregation module is secured; and
the power box secured to a pole of a cell site.

16. The system of claim 11, further comprising:
a cable gland of the aggregation module to secure entry of a cable to the aggregation module.

17. The system of claim 11, further comprising:
a cooling system comprising internal fins positioned internal to the aggregation module and external fins positioned external to the aggregation module.

18. The system of claim 11, further comprising:
the support structure comprising a plurality of slots organized into a set of horizontal layers and a set of vertical layers,
wherein the horizontal layers are orthogonal to the vertical layers,
wherein a horizontal layer of the set of horizontal layers comprises at least two slots of the plurality of slots, and
wherein the vertical layer of the set of vertical layers comprises at least three slots of the plurality of slots.

19. A method comprising:
installing a power box to a pole at a cell site;
installing an aggregation module to the power box, wherein the aggregation module comprises:
a support structure to support a plurality of plug-in cards, wherein the plurality of plug-in cards is insertable along an insertion direction;
wherein the support structure organizes an interior of the aggregation module into six slots with three horizontal layers and two vertical layers;
wherein the horizontal layers are orthogonal to the vertical layers; and
wherein the insertion direction is orthogonal to both the horizontal layers and the vertical layers;
a front access panel openable to access the plurality of plug-in cards;
the support structure and the plurality of plug-in cards forming an airflow path along an airflow direction.

20. The system of claim 11, wherein the aggregation module further comprises:
a plurality of mounting openings aligned with corresponding mounting openings of the power box; and
one or more fasteners extend through the aligned mounting openings to secure the aggregation module to an exterior surface of the power box;
wherein at least one of the plug-in cards comprises an insertion and ejection lever configured to provide a force to insert or eject the plug-in card relative to the support structure.

* * * * *